United States Patent [19]
Yamazaki

[11] Patent Number: 6,011,277
[45] Date of Patent: Jan. 4, 2000

[54] GATE INSULATED FIELD EFFECT TRANSISTORS AND METHOD OF MANUFACTURING THE SAME

[75] Inventor: Shunpei Yamazaki, Tokyo, Japan

[73] Assignee: Semiconductor Energy Laboratory Co., Ltd., Kangawa-ken, Japan

[21] Appl. No.: 09/149,290

[22] Filed: Sep. 9, 1998

Related U.S. Application Data

[62] Division of application No. 08/799,369, Feb. 14, 1997, Pat. No. 5,859,445, which is a division of application No. 08/293,201, Aug. 19, 1994, Pat. No. 5,614,732, which is a continuation of application No. 07/967,564, Oct. 28, 1992, abandoned, which is a continuation of application No. 07/673,821, Mar. 22, 1991, abandoned.

[30]       Foreign Application Priority Data

Nov. 20, 1990 [JP] Japan .................................... 2-316598
Nov. 26, 1990 [JP] Japan .................................... 2-323696

[51] Int. Cl.$^7$ ......................... H01L 29/76; H01L 31/036; H01L 29/04
[52] U.S. Cl. ................. 257/66; 257/57; 257/59; 257/72
[58] Field of Search ................. 257/66, 72, 57, 257/59

[56]              References Cited

U.S. PATENT DOCUMENTS

| 4,363,828 | 12/1982 | Brodsky et al. | 438/485 |
|---|---|---|---|
| 4,460,670 | 7/1984 | Ogawa et al. | 257/53 |
| 4,470,060 | 9/1984 | Yamazaki | 257/59 |
| 4,500,388 | 2/1985 | Ohmura et al. | 257/52 |
| 4,565,584 | 1/1986 | Tamura et al. | 438/481 |
| 4,581,476 | 4/1986 | Yamazaki | 257/53 |

(List continued on next page.)

FOREIGN PATENT DOCUMENTS

| 0144297 | 12/1978 | Japan . |
|---|---|---|
| 55-011329 | 1/1980 | Japan . |
| 55-029154 | 3/1980 | Japan . |
| 55-050663 | 4/1980 | Japan . |
| 55-050664 | 4/1980 | Japan . |

(List continued on next page.)

OTHER PUBLICATIONS

VLSI Technology, Edited by S.M. Sze, McGraw–Hill Book Company, "Chapter 6 Dielectric and Polysilicon Film Deposition" A.C. Adams, pp. 233–235.

Scheid, et al., "Super Large Grain Polycrystalline Silicon Obtained From Pyrolysis of $Si_2H_6$ and Annealing" Jap. J. Appl. Phys. vol. 29, No. 11, Nov. 1990, pp. L 2105–2107.

Blum et al. "Low Pressure CVD Process for Micro and Polycrystalline Silicon" IBM Technical Disclosure Bulletin vol. 26, No. 3A, Aug. 1983, pp. 921–922.

Madsen et al. "In Situ Doping of Silicon Films Prepared by Low Pressure Chemical Vapor Deposition Using Disilane and Phosphine" J. Electrochem. Soc., col. 137, No. 7, Jul. 1990, pp. 2246–2251.

Wolf et al., Silicon Processing for the VLSI Era, vol. 1: Process Technology, Lattice Press, Sunset Beach, CA (1986), pp. 175–176.

(List continued on next page.)

*Primary Examiner*—Mahshid Saadat
*Assistant Examiner*—Jhihan B Clark
*Attorney, Agent, or Firm*—Sixbey, Friedman, Leedom & Ferguson, PC; Eric J. Robinson

[57]               ABSTRACT

A thin film field effect transistors and manufacturing method for the same are described. The channel region of the transistor is spoiled by an impurity such as oxygen, carbon, nitrogen. The photosensitivity of the channel region is reduced by the spoiling impurity and therefore the transistor is endowed with immunity to illumination incident thereupon which would otherwise impair the normal operation of the transistor. The spoiling impurity is not introduced into transistors which are located in order not to receive light rays.

58 Claims, 15 Drawing Sheets

U.S. PATENT DOCUMENTS

| | | |
|---|---|---|
| 4,584,025 | 4/1986 | Takaoka et al. ......................... 438/311 |
| 4,591,892 | 5/1986 | Yamazaki ................................ 257/458 |
| 4,621,276 | 11/1986 | Malhi ....................................... 257/66 |
| 4,659,392 | 4/1987 | Vasudev ................................... 257/66 |
| 4,693,759 | 9/1987 | Noguchi et al. ......................... 438/479 |
| 4,729,009 | 3/1988 | Ang .......................................... 257/411 |
| 4,743,567 | 5/1988 | Pandya et al. ........................... 438/479 |
| 4,755,865 | 7/1988 | Wilson et al. ........................... 257/754 |
| 4,760,008 | 7/1988 | Yamazaki et al. ....................... 430/127 |
| 4,766,477 | 8/1988 | Nakagawa et al. ...................... 257/64 |
| 4,772,927 | 9/1988 | Saito et al. ............................... 257/66 |
| 4,795,679 | 1/1989 | Ramesh et al. .......................... 428/428 |
| 4,814,842 | 3/1989 | Nakagawa et al. ...................... 257/65 |
| 4,818,077 | 4/1989 | Ohwada et al. .......................... 349/34 |
| 4,838,654 | 6/1989 | Hamaguchi et al. .................... 345/87 |
| 4,849,797 | 7/1989 | Ukai et al. ................................ 257/57 |
| 4,864,376 | 9/1989 | Aoki et al. ................................ 257/59 |
| 4,885,052 | 12/1989 | Fan et al. .................................. 117/8 |
| 4,959,700 | 9/1990 | Yamazaki ................................ 257/61 |
| 5,037,766 | 8/1991 | Wang ....................................... 257/352 |
| 5,043,772 | 8/1991 | Yamazaki ................................ 257/53 |
| 5,057,889 | 10/1991 | Yamada et al. .......................... 257/353 |
| 5,082,351 | 1/1992 | Fergason .................................. 349/86 |
| 5,132,820 | 7/1992 | Someya et al. .......................... 349/43 |
| 5,151,689 | 9/1992 | Kabuto et al. ........................... 345/103 |
| 5,236,544 | 8/1993 | Yamagata ................................ 438/73 |
| 5,247,191 | 9/1993 | Yamazaki et al. ....................... 257/72 |
| 5,250,931 | 10/1993 | Misawa et al. .......................... 345/200 |
| 5,261,156 | 11/1993 | Mase et al. ............................... 29/832 |
| 5,270,224 | 12/1993 | Furumura et al. ....................... 438/320 |
| 5,270,567 | 12/1993 | Mori et al. ............................... 257/412 |
| 5,281,840 | 1/1994 | Sarma ...................................... 257/351 |
| 5,289,030 | 2/1994 | Yamazaki et al. ....................... 257/66 |
| 5,289,300 | 2/1994 | Yamazaki et al. ....................... 349/42 |
| 5,315,132 | 5/1994 | Yamazaki ................................ 257/66 |
| 5,349,204 | 9/1994 | Yamazaki ................................ 257/53 |
| 5,349,226 | 9/1994 | Kawaguchi et al. .................... 257/347 |
| 5,372,958 | 12/1994 | Miyasaka et al. ....................... 438/486 |
| 5,383,041 | 1/1995 | Yamazaki et al. ....................... 349/43 |
| 5,402,041 | 3/1995 | Kishino et al. .......................... 315/169.1 |
| 5,404,175 | 4/1995 | Nagae et al. ............................. 348/751 |
| 5,418,636 | 5/1995 | Kawasaki ................................ 348/138 |
| 5,424,752 | 6/1995 | Yamazaki et al. ....................... 345/92 |
| 5,426,526 | 6/1995 | Yamamoto et al. ..................... 349/42 |
| 5,453,858 | 9/1995 | Yamazaki ................................ 349/43 |
| 5,481,121 | 1/1996 | Zhang et al. ............................. 257/64 |
| 5,500,538 | 3/1996 | Yamazaki et al. ....................... 257/49 |
| 5,514,879 | 5/1996 | Yamazaki ................................ 257/65 |
| 5,530,266 | 6/1996 | Yonehara et al. ........................ 257/72 |
| 5,539,550 | 7/1996 | Spitzer et al. ............................ 257/347 |
| 5,614,732 | 3/1997 | Yamazaki ................................ 257/66 |
| 5,712,495 | 1/1998 | Suzawa .................................... 257/51 |
| 5,744,824 | 4/1998 | Kousai et al. ............................ 257/77 |
| 5,851,440 | 12/1998 | Tanaka et al. ............................ 257/66 |

FOREIGN PATENT DOCUMENTS

| | | |
|---|---|---|
| 55-82458 | 6/1980 | Japan . |
| 58-27364 | 2/1983 | Japan . |
| 58-092217 | 6/1983 | Japan . |
| 58-155773 | 9/1983 | Japan . |
| 58-155774 | 9/1983 | Japan . |
| 58-161380 | 9/1983 | Japan . |
| 59-035423 | 2/1984 | Japan . |
| 59-035488 | 2/1984 | Japan . |
| 59-072128 | 4/1984 | Japan . |
| 59-072182 | 4/1984 | Japan . |
| 59-115574 | 7/1984 | Japan . |
| 60-245172 | 12/1985 | Japan . |
| 60-245173 | 12/1985 | Japan . |
| 60-245174 | 12/1985 | Japan . |
| 0004021 | 1/1986 | Japan . |
| 63-96636 | 4/1988 | Japan . |
| 63-219172 | 9/1988 | Japan . |
| 6468724 | 3/1989 | Japan . |
| 1107237 | 4/1989 | Japan . |
| 1128534 | 5/1989 | Japan . |
| 0268064 | 10/1989 | Japan . |
| 1289917 | 11/1989 | Japan . |
| 262077 | 3/1990 | Japan . |
| 2223912 | 9/1990 | Japan . |
| 2251992 | 10/1990 | Japan . |
| 32090924 | 12/1991 | Japan . |
| 5134272 | 5/1993 | Japan . |
| 688971 | 3/1994 | Japan . |

OTHER PUBLICATIONS

H, Ohshima et al., "Future Trends for TFT Integrated Circuits on Glass Substrates," IEDM (IEEE 1989), pp. 157–160.

Journal of Non–Crystalline Solids, vols. 59, 60, Dec. 1983, Part II, pp. 731–734, Proceedings of the Xth International Conference on Amorphous and Liquid Semiconductors, Tokyo, Jap., Aug. 22–26, 1983, C.C. Tsai et al.

Solar Cells 2, (1980), Investigation of the Hydrogen and Impurity Contents of Amorphous Silicon by Secondary Ion Mass Spectrometry, Charles MaGee and David E. Carlson, RCA Laaboratories, Princeon, N.J., pp. 365–376.

The Physics of Hydrogenated Amorphous Silicon I Structure, Preparation, and Devices, Edited by J.D. Joannopoulos and G. Lucovsky, Springer–Verlag, Berlin Heidelberg, New York, Tokyo 1984, pp. 8–9 & 38–41.

Hatalis et al., "High–Performance Thin Film Transistors in Low–Temperature Crystallized LPCVD Amorphous Silicon Films," IEEE Electron Device Letters, vol. EDL–8, No. 8, Aug. 1987, pp. 161–164.

"(Invited) Amorphous Silicon Transistors and Integrated Circuits" Masakiyo Matsumura, Japanese Journal of Applied Physics, vol. 22, (1983) Supplement 22–1, pp.

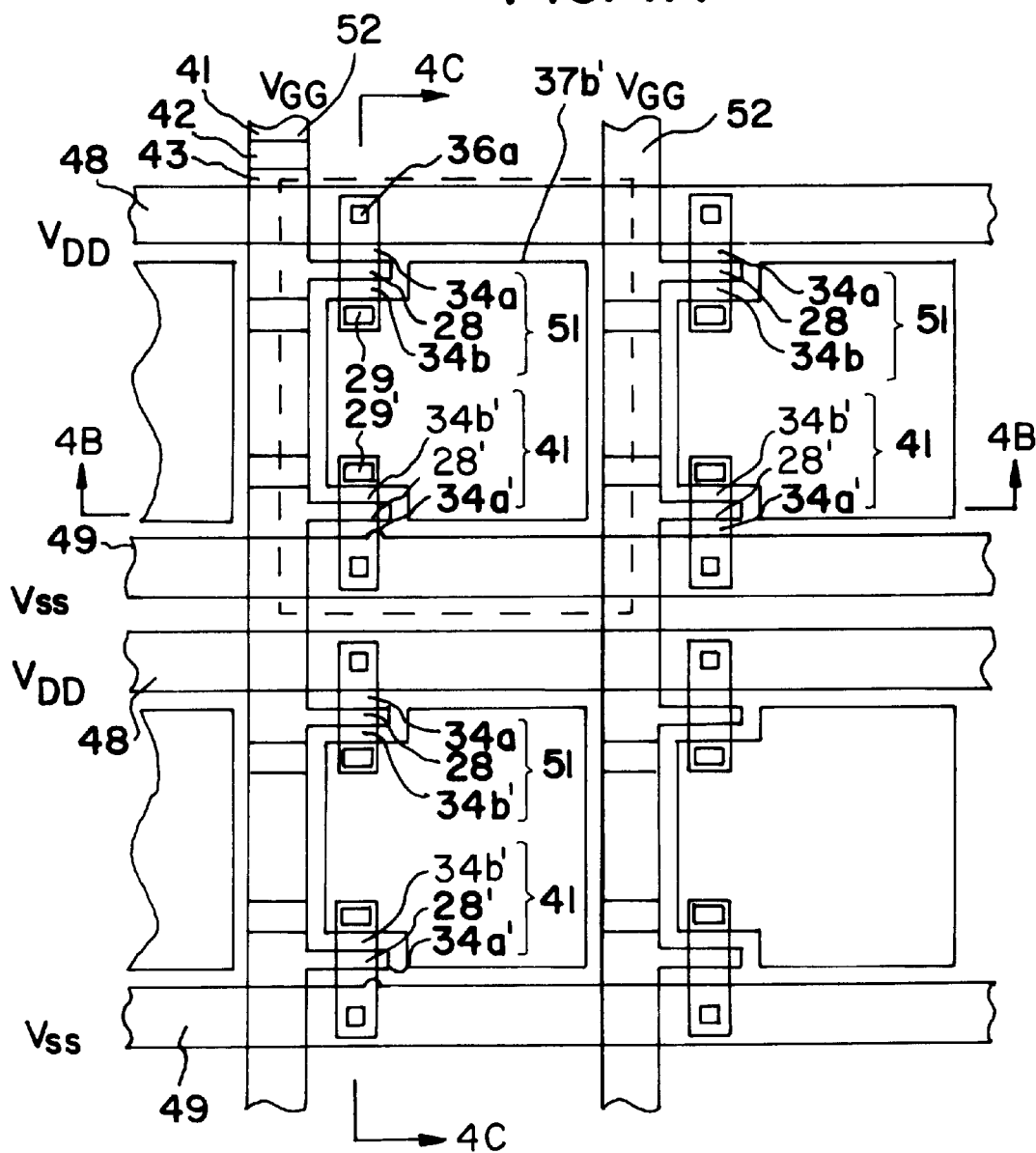

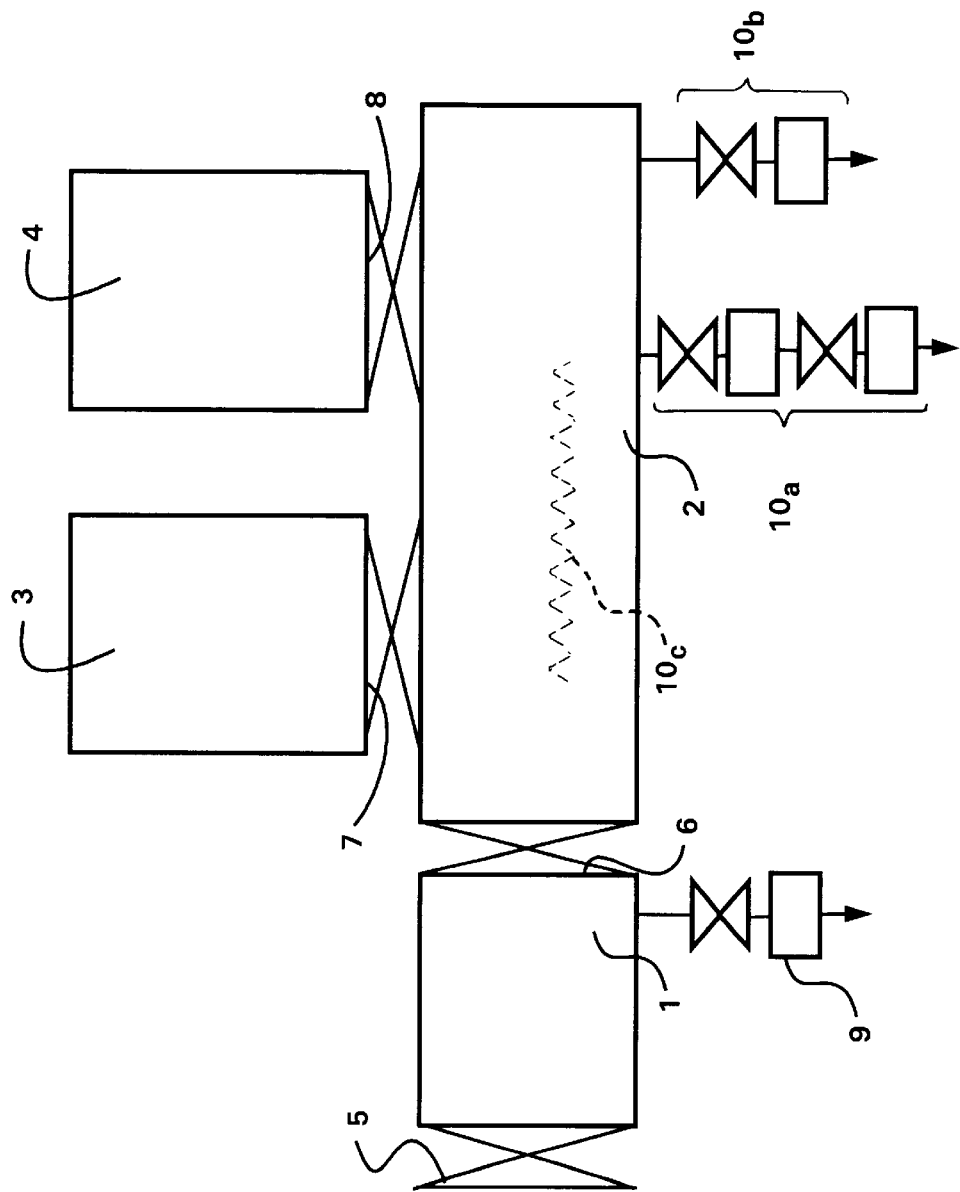

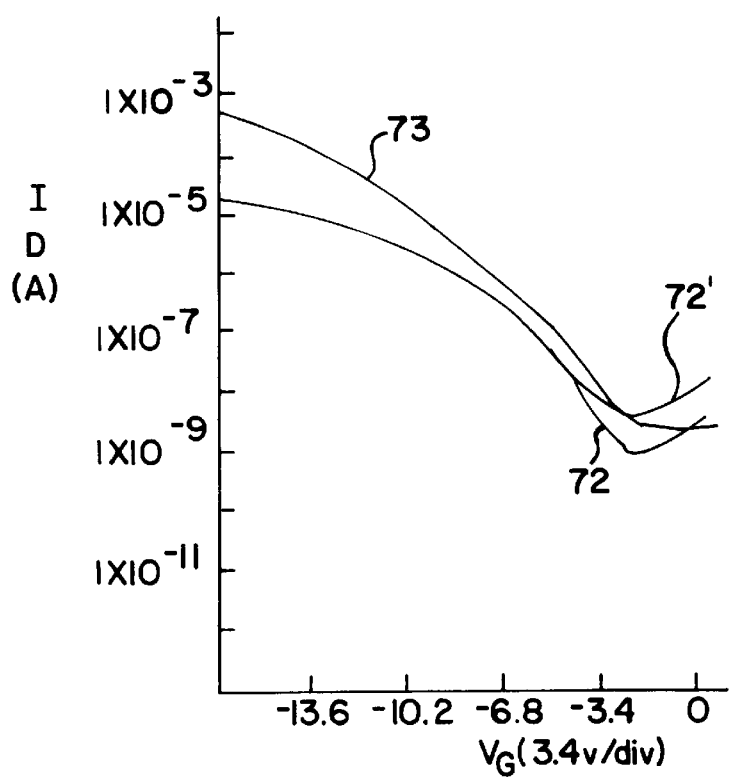
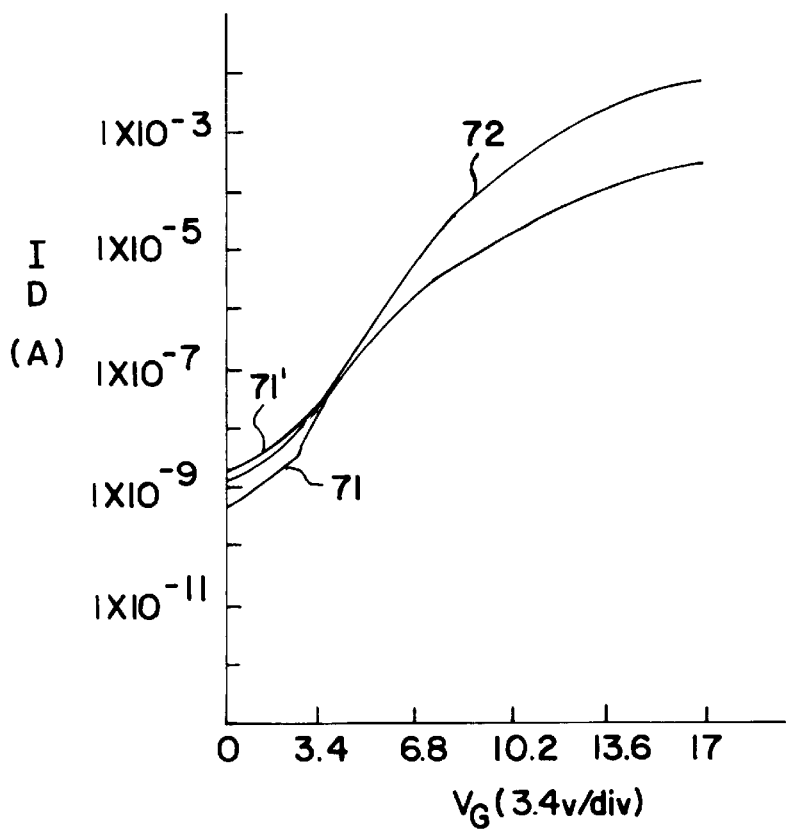

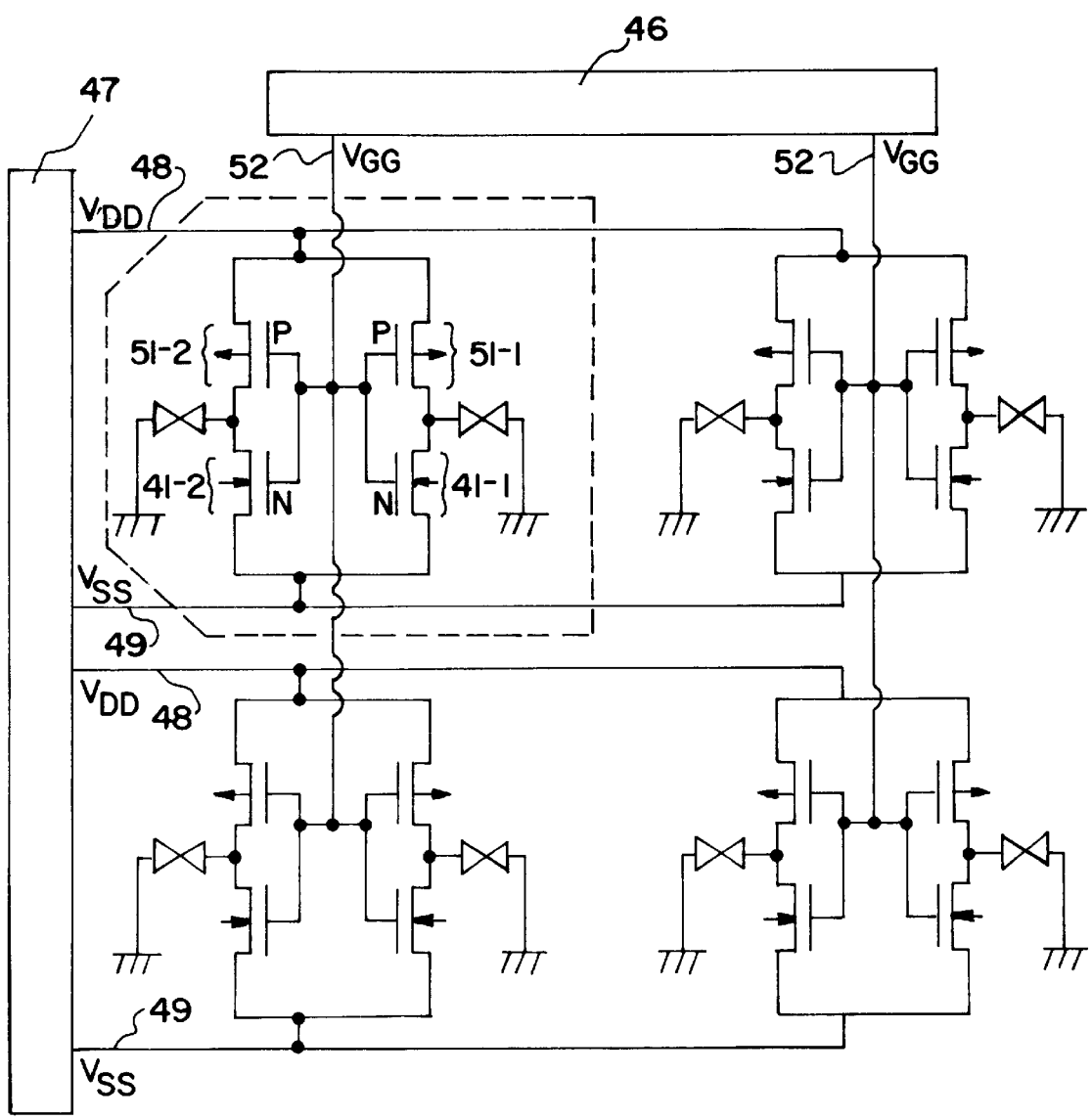

GATE INSULATED FIELD EFFECT TRANSISTORS AND METHOD OF MANUFACTURING THE SAME

This application is a Divisional of Ser. No. 08/799,369, filed Feb. 14, 1997, now U.S. Pat. No. 5,859,445; which itself is a Division of Ser. No. 08/293,201, filed Aug. 19, 1994, now U.S. Pat. No. 5,614,732 Continuation of Ser. No. 07/967,564, filed Oct. 28, 1992, now abandoned, which is a Continuation of Ser. No. 07/673,821, filed Mar. 22, 1991, now abandoned.

BACKGROUND OF THE INVENTION

1. Field of the Invention

The present invention relates to semiconductor device and a method of manufacturing the same and, more particularly to thin film gate insulated field effect transistors suitable for use in liquid crystal displays and a method of manufacturing the same.

2. Description of the Prior Art

There have been well known in the art active liquid crystal displays which are driven by thin film transistors (TFTs). The displays of this type comprise visual panels and peripheral circuits for driving the panel. The peripheral circuit is formed by attaching a single crystalline chip containing integrated circuits on a glass substrate by tab-bonding or COG (chip on glass). The visual panel comprises a plurality of pixels each being provided with a driving TFT. The TFT is usually an N-channel FET formed within an amorphous or polycrystalline semiconductor film which is electrically coupled to a respective pixel.

The carrier mobility in amorphous semiconductors, however, is substantially low, particularly the hole mobility is of the order of 0.1 $cm^2$/Vsec or less. The drain dielectric strength of polycrystalline semiconductors, on the other hand, can not be sufficiently improved because of dangling bonds and impurities such as oxygen collected at grain boundaries, so that it is very difficult to realize usable P-channel TFTs having sufficient characteristics. Furthermore, such TFTs possess photosensitivities, which change Vg-ID characteristics in response to irradiation. Because of this, when used in displays accompanied by back-lights which light up the visual areas, e.g. at 2000 cd, the channel regions of the TFTs have to be covered by particular blind means.

FIG. 1 is a diagram illustrating the equivalent circuit of an exemplary liquid crystal display. The diagram shows only a 2× 2 matrix for the sake of convenience in description whereas ordinary liquid crystal displays consist of more great numbers of pixels such as those in the form of a 640×480 matrix, a 1260×960 matrix and so on. The liquid crystal display includes a liquid crystal layer 42 disposed between a pair of glass substrates 11 and 11' as shown in FIG. 2. Numeral 54 designates a polarizing plate. The inner surface of the glass substrate 11' is coated with a ground electrode 53. The inner surface of the other substrate 11 is provided with a plurality of conductive pads each constituting one pixel of the display. Each conductive pad are formed together with an N-type FET 51 whose source is electrically connected with the corresponding pad. The drains of the FETs on a similar row in the matrix is connected with a control line of the row to which control signals are supplied from a row driver 47. The gates of the N-type FETs on a similar column is connected with a control line of the column to which control signals are supplied from a column driver 46.

In the operation of the display, the column driver 46 supplies control signals of a high level to selected columns to turn on the TFTs on the column. There are, however, undersirable cases in which the on-off action of the TFTs can not sufficiently carry out so that the output voltage of the TFT (i.e. the input to the pixel) reaches only short of a predetermined high voltage level (e.g. 5 V), or the output voltage does not sufficiently fall to a predetermined low voltage (e.g. 0 V). The liquid crystal is intrinsically insulating and, when the TFT is turned off, the liquid crystal voltage (VLC) becomes floating. The amount of electric charge accumulated on the liquid crystal which is equivalent to a capacitance determines the VLC. The accumulated charge, however, will leak through a channel resistance RSD of the photosensitive TFT resulting in fluctuation of the VLC. Because of this, high efficiencies can not be expected when a large number of pixels are formed within one display panel.

BRIEF SUMMARY OF THE INVENTION

It is an object of the present invention to provide gate insulated field effect transistors and a manufacturing method for the transistors which are suitable for use in control circuits of optical devices.

It is another object of the present invention to provide gate insulated field effect transistors consisting of semiconductor films forming channel regions whose characteristics are little influenced by light rays incident thereupon.

Additional objects, advantages and novel features of the present invention will be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

To achieve the foregoing and other object, and in accordance with the present invention, as embodied and broadly described herein, a semiconductor film to form a channel is formed on a substrate in order that the photosensitivity is substantially reduced by introduction of a spoiling agent such as oxygen, carbon, nitrogen or other suitable impurities. The channel is preferably formed within a non-single-crystalline semiconductor film such as semi-amorphous or semi-crsytalline semiconductor film. The drift of the output of the semiconductor transistor is then limited to a tolerable degree even when irradiated with light as bright as 2000 cd. In typical examples, the impurity is introduced into the semiconductor film at a total density of $1 \times 10^{20}$ $cm^{-3}$ to $8 \times 10^{21}$ $cm^{-3}$ (20 atom %), preferably $2 \times 10^{20}$ $cm^{-3}$ to $5 \times 10^{20}$ $cm^{-3}$ (2 atom %). The carrier mobility of the semiconductor film, however, can be improved to 5 $cm^2$/Vsec by thermal treatment at 500° C. to 700° C. to make substantially ineffective the grain boundaries forming barrier against carrier transportation in the semiconductor film in virtue of recrystallization. Accordingly, the deviation of drain current is limited to 10% (on state) or less and two or less order of magnitude (off state), e.g. $10^{-9}$ A(dark current) L$10^{-7}$ A(current under 2000 cd).

In typical example, the transistors according to the present invention are applied to liquid crystal displays. The transistors are preferably formed in a complimentary fashion. Each pixel of the display is provided with a switching element of complimentary thin film field effect transistors which forcibly pull or push the level of the liquid crystal layer to a definite high or low voltage level rather than a floating state.

Of course, the present invention can be applied to a variety of other type transistors such as staggered types, coplanner types, inverted staggered types, inverted coplanner types. When control transistors of a driver for supplying control signals to the switching transistors are formed also on the same substrate at its peripheral position where no light is incident, they are not spoiled by the impurity. In such a case, two types of transistors are formed on the substrate, one being spoiled and the other not being spoiled and having a carrier mobility 2 to 4 times larger than that of the spoiled transistors.

BRIEF DESCRIPTION OF THE DRAWINGS

The accompanying drawings, which are incorporated in and form a part of the invention and, together with the description, serve to explain the principles of the invention.

FIGS. 4(A), 4(B) and 4(C) are plan and cross sectional views showing the liquid crystal display illustrated in FIG. 3.

FIG. 5 is a schematic view showing a system suitable for manufacturing thin film field effect semiconductor transistors in accordance with the present invention.

FIGS. 9(A) and 9(B) are graphical diagrams showing the relationship between the gate voltage and the drain current in response to incident light.

FIG. 11(A) is a schematic diagram showing an equivalent circuit of a liquid crystal display in accordance with a third embodiment of the present invention.

DETAILED DESCRIPTION OF THE PREFERRED EMBODIMENTS

Figure 2:
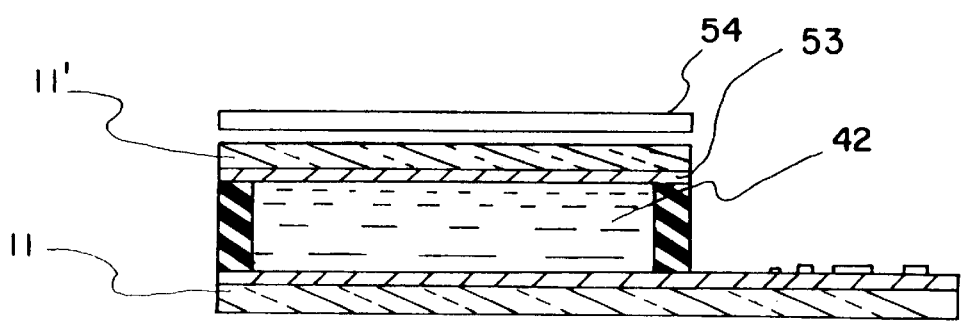
FIG. 2 is a cross sectional schematic view showing an general configuration of a liquid crystal display.
Figure 3:
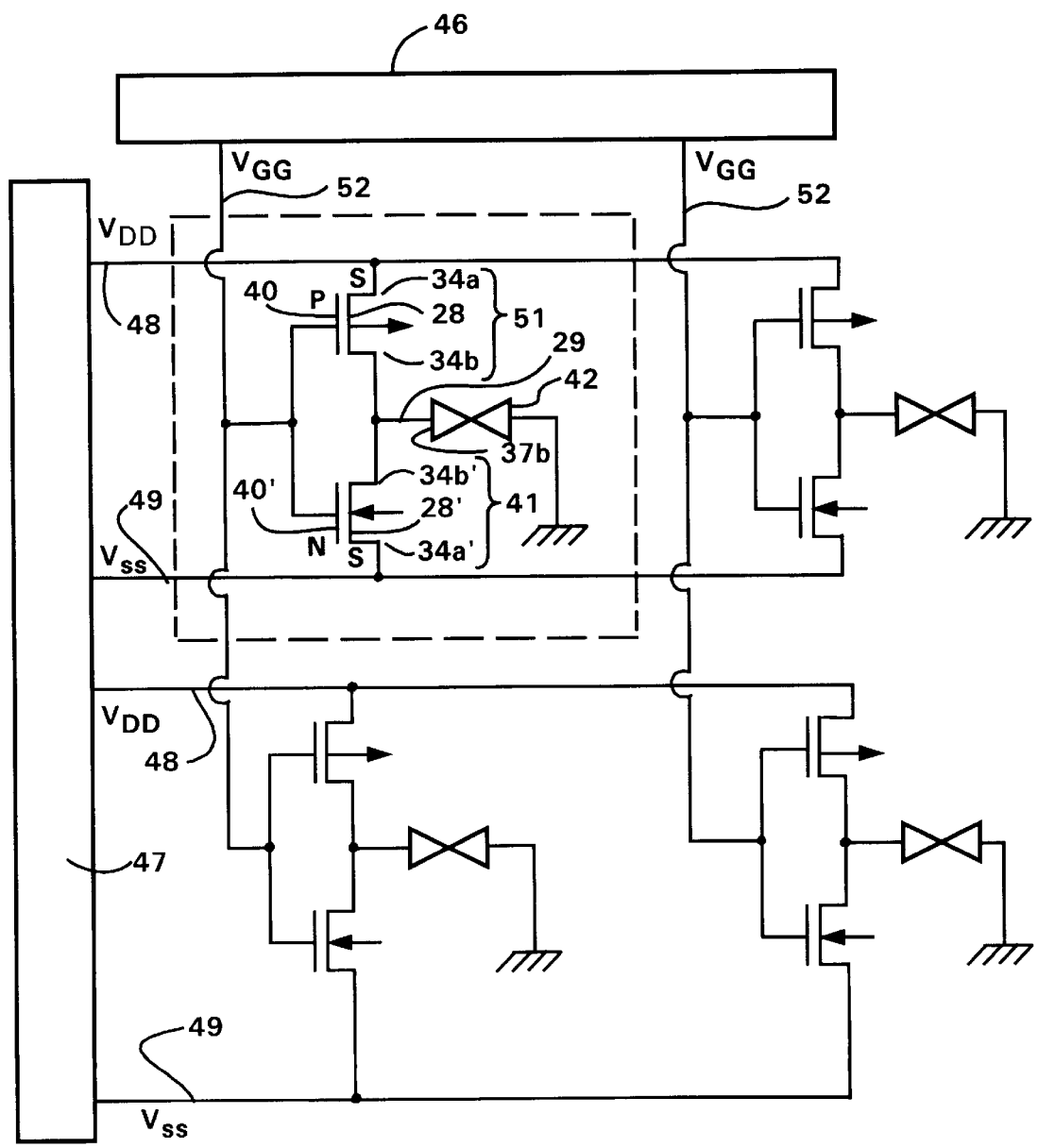
FIG. 3 is a schematic diagram showing an equivalent circuit of a liquid crystal display in accordance with a first embodiment of the present invention.
Figure 4B:
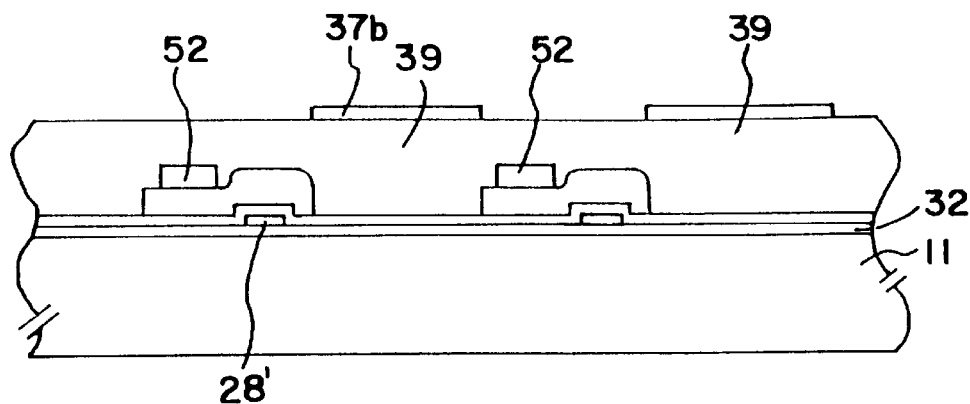

FIG. 3 is a diagram illustrating the equivalent circuit of a liquid crystal display in accordance with a first embodiment of the present invention. The diagram shows only a 2×2 matrix for the sake of convenience in description whereas ordinary liquid crystal displays consist of more great numbers of pixels such as a 640×480 matrix, a 1260×960 matrix. The liquid crystal display includes a liquid crystal layer 42 disposed between a pair of glass substrates 11 and 11' as shown in FIG. 2. The inner surface of the glass substrate 11' is coated with a ground electrode 53. The inner surface of the other substrate 11 is provided with a plurality of conductive pads 37b each constituting one pixel of the display as seen from FIG. 4(A). One pixel is enclosed in the figure by dash line. Each conductive pad 37b are formed on the substrate together with CMOS transistors consisting of an N-type FET 41 and a P-type FET 51 whose drains 34b' and 34b are electrically connected with the corresponding pad 37b. The sources of the P-type FETs of the CMOSs on a similar row is connected with a VDD line 48 of the row. The sources of the N-type FETs of the CMOSs on a similar row is connected with a Vss line 49 of the row. The gates of the P-type and N-type FETs of the CMOSs on a similar column are connected with a VGG line of the column. The Vss lines and the VDD lines are connected with a row driver 47 and supplied with control signal therefrom. The VGG lines 52 are connected with a column driver 46 and supplied with control signal therefrom. The column driver 46 and the row driver 47 are formed on the projected end of the glass substrate 11 as will be understood form the illustration of FIG. 2. In FIG. 4(A), a continuous line is formed on each column by a contact 42 between an upper alminum pattern 41 and a polysilicon pattern 43 as an extension of the gate electrode 28.

When a TN liquid crystal material is used, the distance of the substrates is selected to be about 10 $\mu$m and both the inner surfaces are provided with orientation control films which are given suitable rubbing treatment. When a ferroelectric liquid crystal (FLC) material is used, the distance of the substrates is selected to be about 1.5 to 3.5 $\mu$m, e.g. 2.3 $\mu$m and only one of the inner surfaces (the surface of the ground electrode) is provided with an orientation control film given suitable rubbing treatment. The driving voltage is ±20V. When a liquid crystal material of dispersion type or a polymer liquid crystal material is used, the distance of the substrates is selected to be about 1.0 to 10.0 $\mu$m, e.g. 2.3 $\mu$m and no orientation control film is necessary. The driving voltage is ±10 to ±15V. In this case, polarization plates are also unnecessary and therefore the amount of available light can be relatively increased in either type of transmission and reflective types. Accordingly, whereas the liquid crystal layer possesses no threshold voltage, a large contrast in displayed images is realized and undesirable cross-talk is effectively prevented by the use of complimentary TFTs which provide a definite threshold voltage.

In the operation of the display, the column driver 46 supplies control signals of a low level (10 V for example) to selected columns to connect the VDD line 48 with the pads on the columns and disconnect the Vss line 49 from the pads on the columns. On the other hand, the row driver 47 supplies control signals of a high level (20 V for example) to selected rows by means of the VDD line to pull up the desired pads on the selected columns and rows. In the operation, the non-selected VDD lines and the VSS lines are fixed at the low level. The liquid crystal layer 42 becomes subjected to an electric field at the desired pads and forms an arbitrary visual pattern.

Alternatively, in the operation of the display, the column driver 46 supplies control signals of a high level (0 V for example) to selected columns to connect the Vss line 49 with the pads on the columns and disconnect the VDD line 48 from the pads on the columns. On the other hand, the row driver 47 supplies control signals of a low level (−20 V for example) to selected rows by means of the Vss line to push down the voltage level of the desired pads on the selected columns and rows. In the operation, the non-selected VDD lines and the VSS lines are fixed at the low level. The liquid crystal layer 42 becomes subjected to an electric field at the desired pads and forms an arbitrary visual pattern in the same manner.

Referring now to FIG. 5, FIGS. 6(A) and 6(B) and FIGS. 7(A) to 7(F), a method of manufacturing gate insulated field effect transistors 41 and 51 constituting a CMOS in accordance with a first embodiment of the present invention will be explained. FIG. 5 is a schematic view showing multi-chamber sputtering system for depositing semiconductor and oxide films by magnetron RF sputtering. The system comprises a loading and unloading pre-chamber 1 provided with a gate valve 5, a subsidiary chamber 2 connected to the pre-chamber 1 through a valve 6 and first and second individual sputtering apparatuses 3 and 4 connected to the subsidiary chamber 2 respectively through valves 7 and 8. The pre-chamber 1 is provided with an evacuation system 9 comprising a rotary pump and a turbo molecular pump in series. The subsidiary chamber 2 is provided with a first evacuation system 10a for roughing comprising a rotary pump and a turbo molecular pump in series, a second evacuation system 10b for high vacuum evacuation comprising a cryosorption pump and a heater 10c located in the chamber 2 in order to heat substrates to be coated. If glass substrates to be coated are thermally contracted in advance by heating in the subsidiary chamber 2, thermal contraction and stress caused in films during deposition thereof on the substrate are reduced so that the adhesivity of the films can be improved.

Figure 6A:
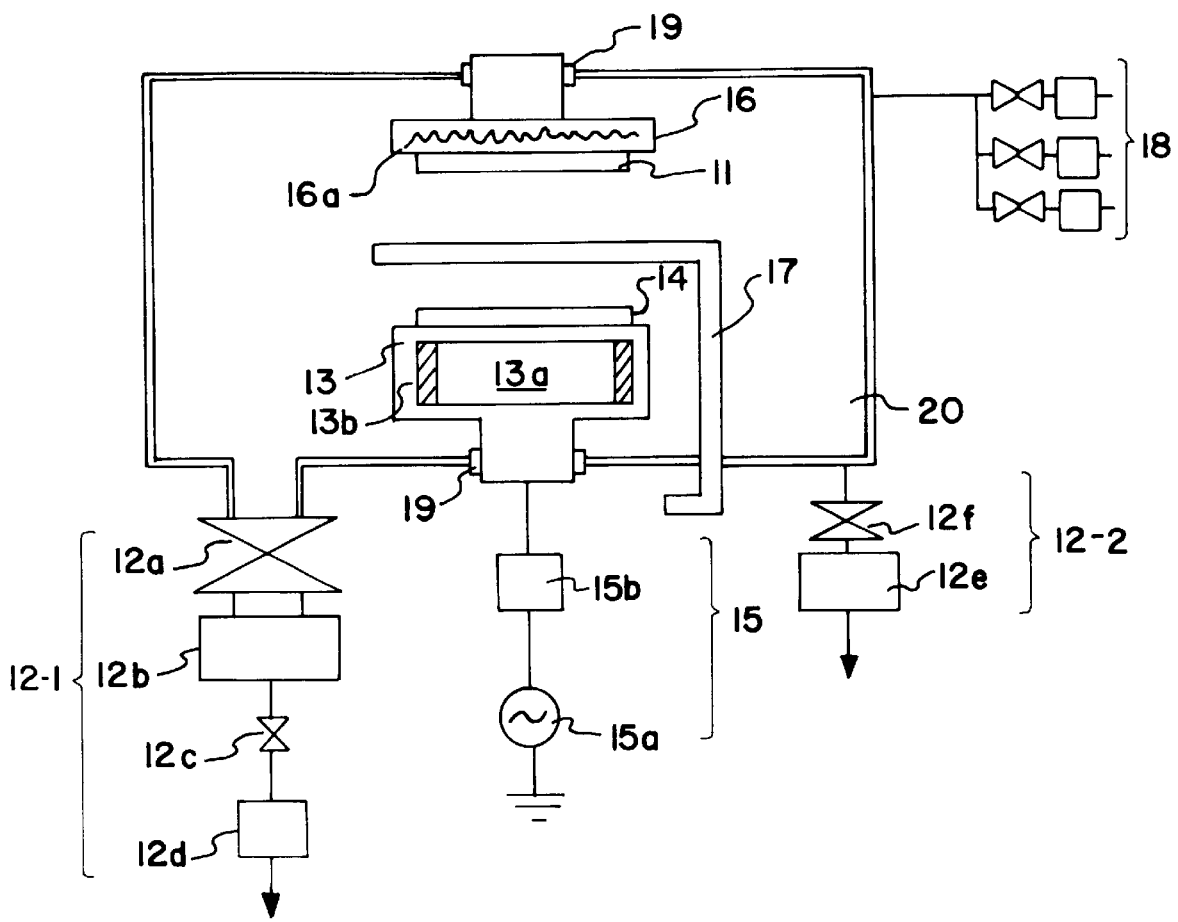
FIG. 6(A) is a schematic view showing a planar type magnetron RF sputtering apparatus of the system illustrated in FIG. 5 suitable for use in depositing oxide and semiconductor films.
Figure 6B:
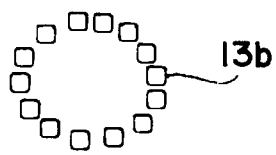
FIG. 6(B) is an explanatory view showing the arrangement of magnets provided in the apparatus as illustrated in FIG. 6(A).

The sputtering apparatuses 3 and 4 are individual planar type magnetron RF sputtering apparatuses suitable for exclusive use in depositing oxide films and semiconductor films respectively when used in accordance with the present invention. FIGS. 6(A) and 6(B) illustrate details of the RF sputtering apparatus. The apparatus comprises a vacuum chamber 20, a first evacuation system 12-1 for roughing consisting of a turbo molecular pump 12b and a rotary pump 12d respectively provided with valves 12a and 12c, a second evacuation system 12-2 for high vacuum evacuation comprising a cryosorption pump 12e provided with a valve 12f, a metallic holder 13 fixed in the lower side of the chamber 20 for supporting a target 14 thereon, formed with an inner conduit 13a through which a coolant can flow to cool the target 14 and provided with a number of magnets 13b such as permanent magnets, an energy supply 15 consisting of an RF (e.g. 13.56 MHz) source 15a provided with a matching box 15b for supplying RF energy to the holder 13, a substrate holder 16 located in the upper position of the chamber 20 for supporting a substrate 11 to be coated, a heater 16a embedded in the substrate holder 16, a shutter 17 intervening the substrate 11 and the target 14 and a gas feeding system 18. Numeral 19 designates sealing means for ensuring air-tight structure of the vacuum chamber 20. In advance of actual deposition on the substrate 11, impurities occurring in the targets are sputtered and deposited on the shutter 17 intervening the substrate 11 and the target 14, and then the shutter is removed in order to enable normal deposition on the substrate 11. The magnets 13b are oriented to have their N poles at the upper ends and S poles at the lower ends and horizontally arranged in a circle as illustrated in FIG. 6(B) in order to confine electrons in a sputtering region between the substrate 11 and the target 14.

Referring now to FIGS. 7(A) to 7(F) together with FIG. 5 and FIGS. 6(A) and 6(B), a method of manufacturing thin film field effect transistors 41 and 51 in accordance with the first preferred embodiment of the invention will be described in details. This exemplary method is carried out with a multi-chamber apparatus suitable for mass-production. This is, however, applicable to similar processes utilizing separate chambers without substantial modification.

10 sheets of glass substrate are mounted on a cassette and placed in the loading and unloading pre-chamber 1 through the valve 5. The substrates may be made from a glass which can endure thermal treatment at high temperatures Up to 700° C., e.g. about, 600° C. such as NO glass manufactured by Nippon Electric Glass Co. Ltd, LE-30 glass manufactured by Hoya Co. or VYCOR glass manufactured by Corning Corp. After adjusting the inner conditions of the pre-chamber 1 and the subsidiary chamber 2 to each other, the cassette is transported from the pre-chamber 1 into the subsidiary chamber 2 through the valve 6. One of the glass substrates is disposed in the first magnetron RF sputtering apparatus as shown in FIG. 6(A) by means of a transportation mechanism (not shown) and coated with a SiO2 film 32 as a blocking film to a thickness of 1000 Å to 3000 Å in a 100% $O_2$ atmosphere (0.5 Pa) at a substrate temperature of 150° C. The output power of the apparatus is 400 W to 800 W in terms of 13.56 MHz RF energy. A single crystalline silicon or a quartz block is used as a target. The deposition speed is 30 Å/min. The coated substrate is then exchanged by another of the remaining 9 substrates which is subsequently coated with a $SiO_2$ film in the same manner. All the substrates mounted on the cassette are coated with a $SiO_2$. film by repeating this procedure. During this procedure, the transportation of a substrate between the pre-chamber 1 and the subsidiary chamber 2 has to be carried out after adjusting the pressures and the inner atmospheres of the chambers 1 and 2 to each other in order to eliminate undesirable impurities.

An amorphous silicon film 33 is next deposited in the second sputtering apparatus 4 on the $SiO^2$ film 32 to a thickness of 500 nm to 1 $\mu$m, e.g. 2000 Å. The total density of oxygen, carbon and nitrogen in the amorphous film has not to exceed $7 \times 10^{19}$ cm$^{-3}$, preferably not to exceed $1 \times 10^{19}$ cm$^{-3}$. Such low density makes it easy to recrystallize the silicon film in the latter step by thermal treatment whereas the silicon film is endowed with photosensitivity. First, the 10 substrates are placed into the apparatus 4 one after another from the subsidiary chamber 2 in the same manner and treated therein for deposition of the amorphous silicon film. The transportation of each substrate between the apparatus 4 and the subsidiary chamber 2 is carried out after adjusting the pressures and the inner atmospheres of the chambers 2 and 4 in order to eliminate undesirable impurities. This procedure is generally employed when it is desired to transport the substrates between the first or second sputtering apparatus and the subsidiary chamber, even if not particularly described hereinbelow. The atmosphere in the apparatus 4 comprises a mixture consisting of hydrogen and argon so that $H^2/(H^2+Ar)=0.8$ (0.5 to 0.8 in general) in terms of partial pressure. The hydrogen and argon gases desirably have purities of 99.999% and 99.99% respectively and are introduced after the inside of the apparatus 4 is evacuated to a pressure not higher than $1 \times 10^{-5}$ Pa. The total pressure is 0.5 Pa: the output power of the apparatus is 400 W to 800 W in terms of 13.56 MHz RF energy: a single crystalline silicon desirably containing oxygen atoms at a concentration of no higher than $5 \times 10^8$ cm$^{-3}$, e.g. $1 \times 10^8$ cm$^{-3}$ is used as a target: and the substrate temperature is maintained at 150° C. (deposition temperature) by the heater 16a in the same manner. In preferred embodiments, the hydrogen proportion in the mixture may be chosen between 5% and 100%; the deposition temperature between 50° C. and 500° C., e.g. 150° C.; the output power between 1 W and 10 MW in a frequency range from 500 Hz to 100 GHz which may be combined with another pulse energy source.

Alternatively, the amorphous silicon film 33 may be deposited by low pressure CVD (LPCVD) or plasma CVD. In the case of LPCVD, the deposition is carried out by introducing disilane ($Si_2H_6$) or trisilane ($Si_3H_8$) in a suitable CVD chamber. The deposition temperature is selected at a temperature 100° C. to 200° C. lower than the recrystallization temperature of the silicon, i.e. 450° C. to 550° C., for example 530° C. The deposition speed is 30 to 100 Å/min. Boron may be introduced at $1\times10^{15}$ $cm^{-3}$ to $5\times10^{17}$ $cm^{-3}$ into the film by using diboran as a dopant gas together with the silane in order to make even the threshold voltages of N-type and P-type TFTS. In the case of plasma CVD, the deposition is carried out by introducing monosilane ($SiH_4$) or disilane ($Si_2H_6$) at 300° C. in a suitable plasma CVD chamber. The input energy is for example high frequency electric energy at 13.56 MHz.

After all the substrates are coated with the silicon oxide and amorphous silicon semiconductor films, the amorphous silicon semiconductor film 33 is patterned by means of a photomask as indicated by to leave areas 33 and 33' necessary to form N-channel and P-channel transistors. A photoresist film (dashed line in FIG. 7(A)) is then coated on the substrate 11 and patterned by means of another photomask in order to provide openings 26 and 26' to the semiconductor films 33 and 33'. Through these openings, carbon, nitrogen or oxygen is introduced into the semiconductor films, as indicated in Figures by dashed areas, by ion implantation, e.g. at $2\times10^{14}$ to $1\times10^{16}$ $cm^{-2}$ in the case of oxygen introduction. The acceleration voltage is 30 to 50 KeV, e.g. 35 KeV. The lengths of the impurity regions are determined at 10 to 15 $\mu$m in accordance with the channel lengths of transistors to be formed but slightly larger than them as explained below. Namely, the end portions of 0–5 $\mu$m are to be part of the source and the drain and the central rest to be the channel region of 10 $\mu$m length. The impurity of carbon, nitrogen or oxygen functions to spoil the photosensitivity of the semiconductor films 26 and 26'. The amount of the impurity, however, must not be too much to recrystallize the semiconductor films in the latter thermal treatment so that the carrier mobility can not reach desirable level such as 5 $cm^2$/Vsec or higher, preferably 10 to 100 $cm^2$/Vsec. After all the substrates are coated with the silicon oxide and amorphous silicon semiconductor films, patterned and ion implanted as described above, thermal treatment is given thereto in the subsidiary chamber 2 by means of the heater 10c at an intermediate temperature not to cause crystal growth, such as 500° C. to 750° C., typically at 600° C., for 12 to 70 hours in a non-oxidizing atmosphere, e.g. a hydrogen or a nitrogen atmosphere. Since the underlying surface comprises amorphous structure of the silicon oxide film 32, there are no particular core of crystal growth so that the thermal annealing is uniformly effective in the semiconductor films. The film is recrystallized by this treatment (thermal annealing) in the form of semi-amorphous or semi-crystalline structure. In accordance with experiments, it was confirmed by SIMS (secondary ion mass spectroscopy analysis) that oxygen, carbon and hydrogen were involved in the spoiled regions respectively at densities of $2\times10^{21}$ $cm^{-3}$) $4\times10^{17}$ $cm^{-3}$ and $4\times10^{20}$ $cm^{-3}$ equivalent to one atom % assuming the density of silicon being $4\times10^{22}$ $cm^{-3}$. These figures of density were minimum values of the respective elements which varied along the depth direction. The reason why these minimum values were employed is that a natural oxide existed at the surface of the semiconductor film. The evaluation of these densities should be made with reference to the oxygen density in the silicon target ($1\times10^{18}$ $cm^{-3}$).

In accordance with experiments, the recrystallization was possible by heat treatment at 600° C. for 48 hours if the thickness of the semiconductor films was 1000 Å in the case of $1.5\times10^{20}$ $cm^{-3}$ (oxygen density). In the case of $5\times10^{21}$ $cm^{-3}$, however, the thickness had to be increased to 0.3 to 0.5 $\mu$m for recrystallization. When the thickness remained at 1000 Å, the temperature during thermal annealing must be elevated to 650° C. for performing sufficient recrystallization. The recrystallization becomes easy by increasing the film thickness or decreasing the impurity density. The photoconductivity becomes conspicuous as the impurity densityh decreases.

On the other hand, when annealed at more higher temperatures such as 900 to 1200° C., the impurity of oxygen, carbon or nitrogen tends to be collected at grain boundaries to form barrier against carrier transportation in accordance with undesirable solid phase crystal growth. The mobility is then lowered to 5 $cm^2$/Vsec or less so that the dielectric strength decreases because of leakage across the drain junction.

Figure 7A:
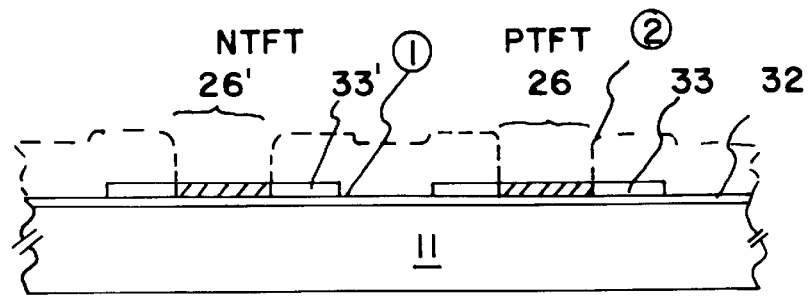
FIGS. 7(A) to 7(F) are cross sectional views showing a method of manufacturing thin film field effect semiconductor transistors in accordance with the first embodiment of the present invention.
Figure 7B:
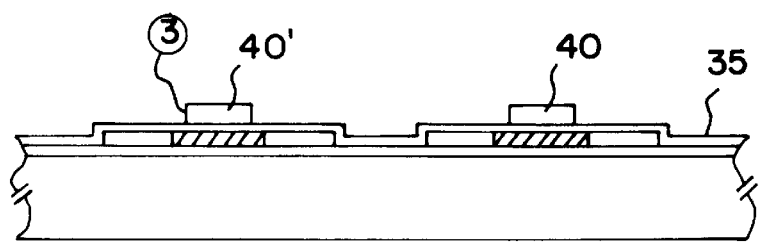

The substrates are placed again in the first sputtering apparatus 3. The entire structure is then coated with a silicon oxide film 35 of a thickness of 500 Å to 2000 Å, e.g. 1000 Å by sputtering in an oxide atmosphere as illustrated in FIG. 7(B). The deposition condition is same as that of the silicon oxide film 32 explained above. The characteristics at the interface between the silicon oxide film 35 and the underlying semiconductor film 36 can be improved by applying ultraviolet rays to carry out ozone oxidation. Namely, the interface states can be decreased by utilizing photo-CVD together with the sputtering explained in the description of deposition of the oxide film 32. Alternatively, fluorine may be introduced in this deposition, In this case, the atmosphere comprises a high density oxygen (95%) including $NF_3$ (5%) at a total pressure of 0.5 Pa: the output power of the apparatus is 400 W in terms of 13.56 MHz RF energy: a single crystalline silicon or an artificial quartz is used as a target: and the substrate temperature is maintained at 100° C. By this procedure, the silicon oxide film 35 to be a gate insulating film includes fluorine atoms which function to terminate dangling bonds of silicon atoms so that the formation of fixed charge can be prevented at the interface between the semiconductor films 33 and 33' and the oxide film 35. On the silicon oxide film 35 is deposited by sputtering a silicon semiconductor film of 0.2 $\mu$m thickness which is highly doped with phosphorus at $1\times10^{20}$ to $5\times10^{20}$ $cm^{-3}$ followed, if desired, by coating thereon of a conductive film of 0.3 $\mu$m thickness made of molybdenum, tungsten, $MoSiO_2$ or $WSIO_2$. The semiconductor film coated with the conductive (multiple) film is then patterned by photolithography with a suitable mask in order to form gate electrodes 40 and 40'.

Figure 7C:
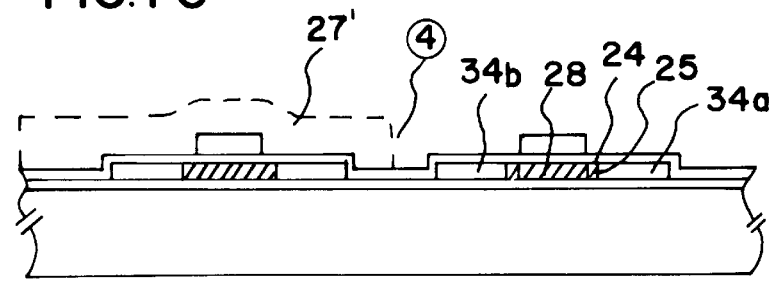
Figure 7D:
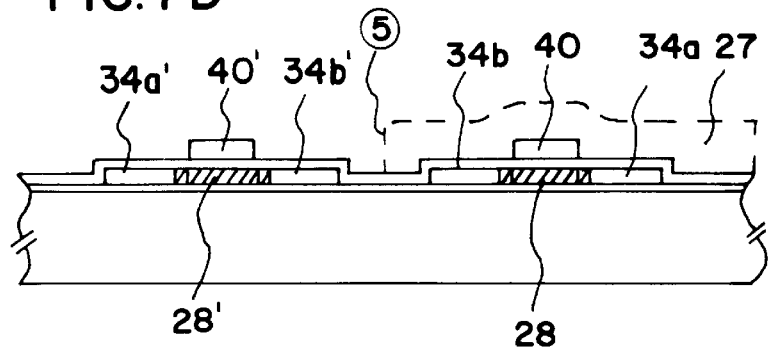
Figure 7E:
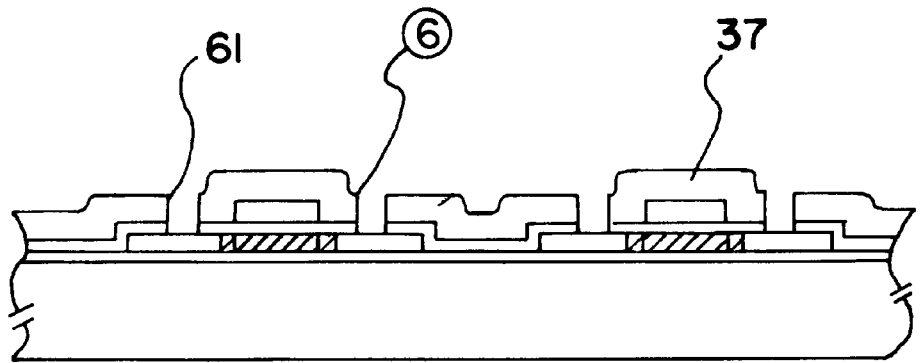

A photoresist film 27' is formed by the use of a photomask in order to cover the semiconductor film 33'. With the gate electrode 40 and the photoresist film 27', self-aligned impurity regions, i.e. a source and a drain region 34a and 34b are formed by ion implantation of boron at $1\times10^{15}$ $cm^{-2}$ to $2\times10^{15}$ $cm^{-2}$. The intermediate region 28 of the silicon semiconductor film 33 between the impurity regions 34a and 34b is then defined as a channel region as illustrated in FIG. 7(C). After removing the photoresist film 27', another photoresist film 27 is formed by the use of a photomask in order to cover the semiconductor film 33. With the gate electrode 40' and the photoresist film 27', self-aligned impurity regions, i.e. a source and a drain region 34a' and 34b' are formed by ion implantation of phosphorus at $1 \times 10^{15}$ cm$^{-2}$. The intermediate region 28' of the silicon semiconductor film 33 between the impurity regions 34a' and 34b' is then defined as a channel region as illustrated in FIG. 7(D). The ion implantation may instead be carried out by selectively removing the silicon oxide film 35 by the use of the gate electrode 40 or 40' as a mask followed by direct ion implantation of boron or phosphorus. It should be noted that the widths of the gate electrodes 40 and 40' are selected to be 10 μm corresponding to the channel widths so that the underlying impurity regions doped with oxygen may extend beyond the edges of the channels by 0 to 5 μm.

After removing photoresist 27, the channel regions are then thermally annealed at 630° C. for 10 to 50 hours in H$_2$ atmosphere to make active the impurities in the drain and source regions. Since the impurity density is substantially low, the recrystallization in the source and drain regions goes on more quickly. As a result, the ionization ratio (the number of acceptor or donor ions/the number of introduced impurity ions) can be controlled between 50% and 90%.

The source and drain regions and the spoiled region including the channel region are partially overlapped with each other so that there are formed few definite grain boundaries at the N+–I and P+–I interfaces and a high drain dielectric strength can be expected.

Figure 4C:
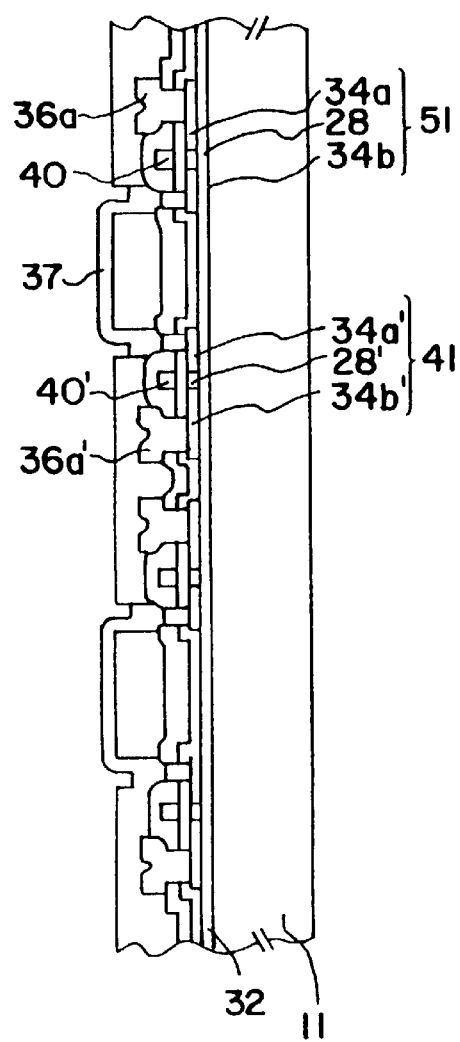
Figure 7F:
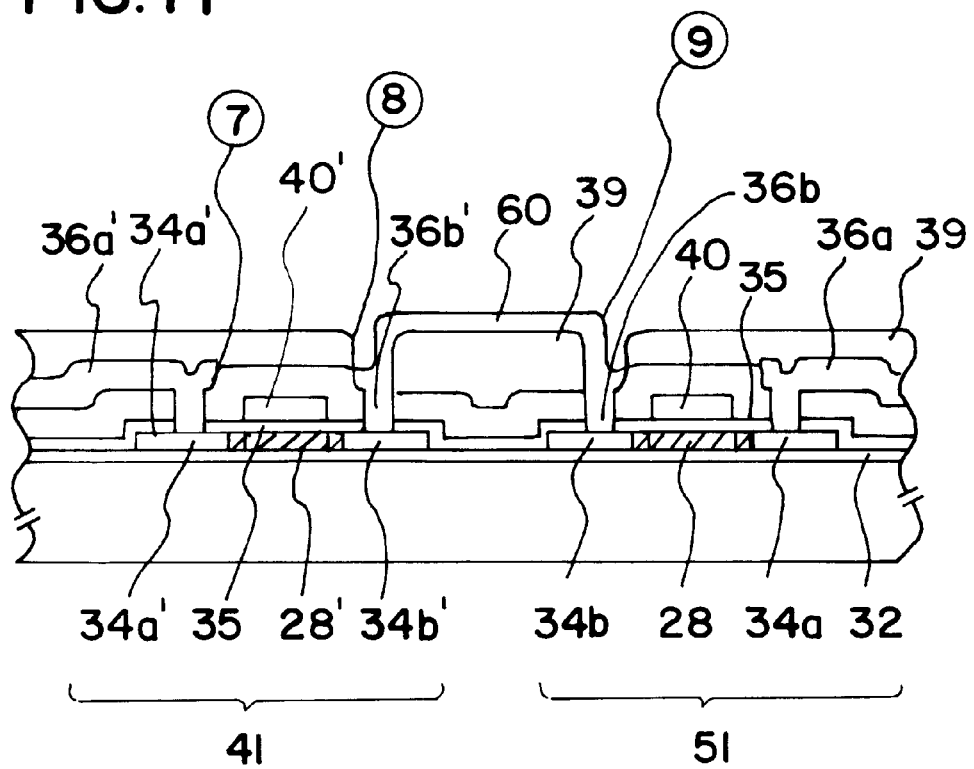

An interlayer insulating film 37 of silicon oxide is deposited over the entire surface of the structure followed by etching by means of a photomask for opening contact holes 39 through the interlayer film 37 and the oxide film 35 in order to provide accesses to the underlying source and drain regions 34a, 34b, 34a' and 34b'. The deposition of the interlayer insulating film 37 is carried out to a thickness of 0.2 to 2.0 μm by LPCVD or photo-CVD. Next, an aluminum film of 0.5 to 1 μm thickness is deposited an the structure over the contact holes 39 and patterned to form source and drain electrodes 36a, 36b, 36a' and 36b' by means of a photomask as illustrated in FIG. 7(F). Finally, an organic resin film 39 is coated over the structure and patterned by means of a photomask to provide accesses to the drain electrodes 36b and 36b' followed by formation of lead electrode 37 made of a transparent conductive material such as indium tin oxide (ITO) to be electrically connected with the pad 37b. The ITO film is deposited by sputtering at room temperature to 150° C. followed by annealing in an oxidizing atmosphere (O$_2$) or in air at 200 to 300° C. The pad 37b can be formed at the same time by the deposition of the lead electrode 37. Then, the formation of CMOS transistors is finished. An area corresponding to one pixel is enclosed by dashed line in FIG. 4.

Figure 8A:
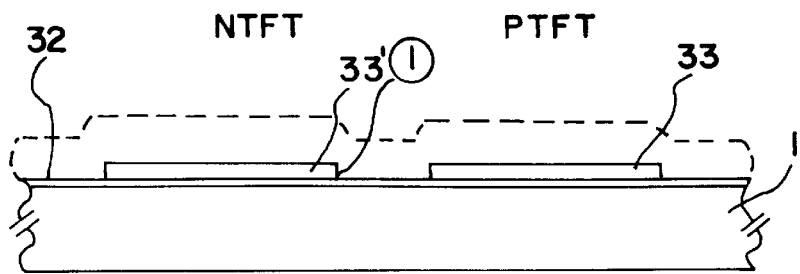
FIGS. 8(A) to 8(F) are cross sectional views showing a method of manufacturing thin film field effect semiconductor transistors which are used in peripheral circuits for liquid crystal display.
Figure 8B:
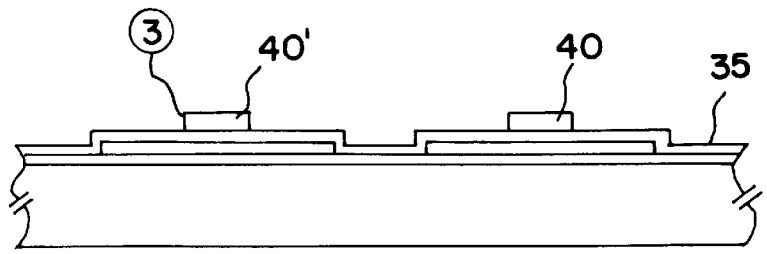
Figure 8C:
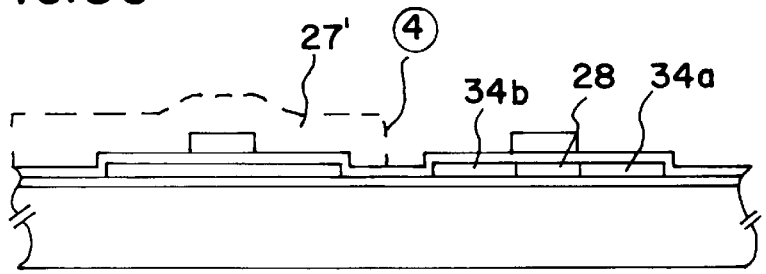
Figure 8D:
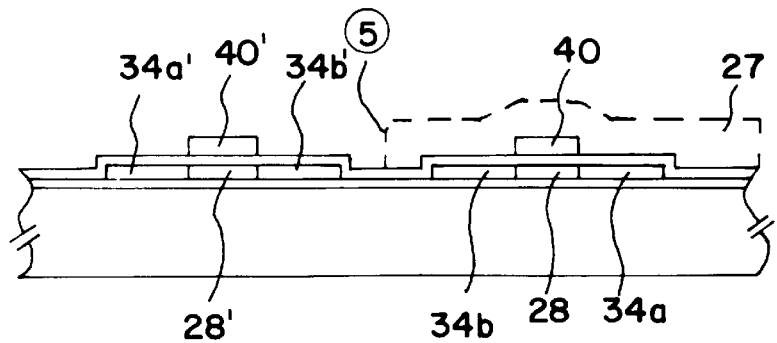
Figure 8E:
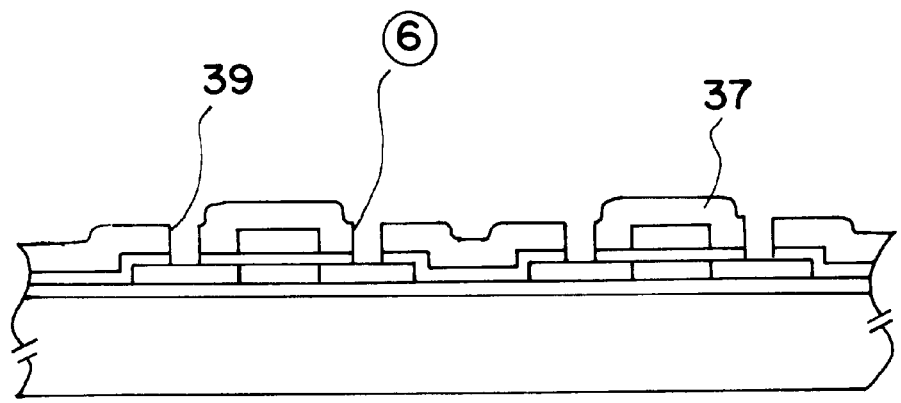
Figure 8F:
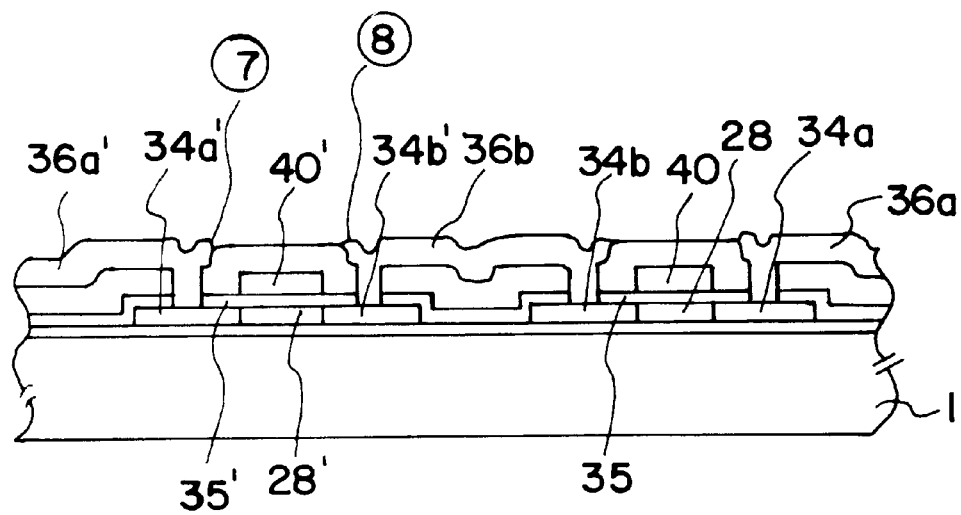

The formation for TFTs of the column and row drivers can be carried out on the same substrate 11 at the same time in the same manner except for those particularly described in the followings. FIGS. 8(A) to 8(F) showing this formation correspond to FIGS. 7(A) to 7(F). When the silicon semiconductor films 33 of FIG. 7(A) are coated with the photoresist film having openings 26 and 26', the semiconductor films 33 of FIG. 8(A) are entirely coated with the photoresist film because no impurity is introduced thereinto. Since no spoiling impurity such as oxygen is used, high carrier mobilities of the TFTs can be expected while the TFTs possess high photosensitivities. The photosensitivities do not substantially deteriorate the performance of the TFTs and the operation of the liquid crystal display because the TFTs are located apart from the display panel exposed to illumination. In this case, the advantage of the above explained manufacturing process is significant without the effect of the spoiling impurity. Namely, the semiconductor film 33 is deposited in the form of semi-amorphous or semi-crystal structure. Of course, the advantage takes place also in the case of the formation as illustrated in FIGS. 7(A) to 7(F) even not so significant. Anyway, one of the advantages of the above process is that the formation of these transistors (spoiled and not spoiled) can be carried out at temperatures no higher than 700° C. so that the process does not require the use of expensive substrates such as quartz substrates and therefore suitable for large scale liquid crystal displays production methods. The glass substrate thus provided with these CMOS transistors and suitable conductive patterns as illustrated is joined with a counterpart glass substrate provided with an electrode at its inner surface followed by injection of a liquid crystal material between the two substrates.

Next, the mechanism of formation of semi-amorphous or semi-crystalline semiconductor material in accordance with the present invention will be explained. When sputtering a single crystalline silicon target in a mixture of hydrogen and argon, high energy heavy argon atoms collide with the surface of the target, dislodge therefrom clusters each consisting of several tens to several hundred thousands of silicon atoms, and deposit the clusters on a substrate to be coated. These clusters pass through the mixture gas in advance of the deposition on the substrate and are coupled with hydrogen atoms at their external surfaces in order to terminate their dangling bonds. Accordingly, when deposited on the substrate, the clusters comprise internal amorphous silicon and external ordered silicon including Si—H bonds. The Si—H bonds react with other Si—H bonds and are converted to Si—Si bonds by thermal treatment at 450° C. to 700° C. in a non-oxidizing atmosphere. These coupling of adjacent silicon atoms (Si—Si) function to let adjacent clusters be attracted to each other whereas these clusters have a tendency to convert their phases to more ordered phases (partial recrystallization). As a result, the crystalline structure of these clusters is given lattice distortion and the peak of its Raman spectra (522 cm$^{-1}$: the peak of single crystalline silicon) is displaced to the low frequency direction. The apparent grain diameter calculated based on the half-width is 50 to 500 Å which seems to indicate microcrystals.

The energy bands of the clusters are connected through the Si—Si bonds anchoring the clusters at the interfaces therebetween. For this reason, the polycrystalline (semi-amorphous or semi-crystalline) structure of silicon in accordance with the present invention is entirely different than usual polycrystals in which grain boundaries provide barriers against carrier trans-portation, so that the carrier mobility can be on the order of 15 to 100 cm$^2$/Vsec (electron mobility) and 10 to 50 cm$^2$/Vsec (hole mobility). Namely, the semi-amorphous or semi-crystalline structure in accordance with the present invention can be considered substantially not to include undesirable grain boundaries. Of course, if the semiconductor is subjected to high temperatures of 1000° C. or higher rather than the relatively low temperatures of 450° C. to 700° C., latent oxygen atoms come to appear at the boundaries between the clusters and form barriers like the prior art technique. The carrier mobility can be improved by increasing the strength of the anchoring. For this purpose, the oxygen density in the semiconductor film is decreased to $7 \times 10^{19}$ cm$^{-3}$, desirably to $1 \times 10^{19}$ cm$^{-3}$ (this is not the case of FIGS. 7(A) to 7(F)).

FIGS. 9(A) and 9(B) are graphical diagrams showing the relationship between the gate voltage and the drain current of the TFTs manufactured in accordance with FIGS. 7(A) to 7(F) employing the spoiling impurity and FIGS. 8(A) to 8(F) without the spoiling impurity. FIG. 9(A) shows the characteristics of the P-channel TFTS. Curve 72 of FIG. 9(A) represents the characteristics of the P-channel TFT employing the spoiling impurity. In accordance with experiments, this characteristics changed to curve 72' when irradiated with 2000 cd light. As shown in the figure, the drift of the drain current was limited within one order of magnitude in the sub-threshold region. Curve 73 of FIG. 9(A) represents the characteristics of the P-channel TFT without the spoiling impurity. FIG. 9(B) shows the characteristics of the N-channel TFTS. Curve 71 of FIG. 9(B) represents the characteristics of the N-channel TFT employing the spoiling impurity. This characteris-tics changed to curve 71' when irradiated with 2000 cd light. As shown in the figure, the drift of the drain current was limited within one order of magnitude in the cut-off region. Curve 72 of FIG. 9(B) represents the characteristics of the N-channel TFT without the spoiling impurity. The drift of drain current could be neglected when the oxygen density in the semiconductor film was no lower than $3 \times 10^{21}$ cm$^{-3}$. Contrary to this, there was observed substantial drift of drain current when the oxygen density in the semiconductor film was as low as $8 \times 10^{19}$ cm$^{-3}$ or less.

The following is data of the characteristics of the TFTs as manufactured in accordance with the above procedure with an exception that the channel length is 5 μm (channel width is 15 μm).

| | TFTs shown in FIG. 7(F) | | | |
|---|---|---|---|---|
| | μ | Vth | $V_{BVD}$ | PS |
| P-Channel | 16 | −5.3 | −24 | NO |
| N-Channel | 25 | +4.7 | +27 | NO |
| P-Channel | 45 | −4.8 | −21 | YES |
| N-Channel | 68 | +4.1 | +24 | YES |

In the above data, "μ" is the carrier mobility in units of cm$^2$/V·s; "Vth" is the threshold voltage (the gate voltage when ID=0.1 μA) in units of V; "$V_{BDV}$" is the drain dielectric strength in units of V; and "PS" is the effective photosensitivity.

In the above embodiment, thermal annealing is carried out twice at the steps corresponding to FIGS. 7(A) and 7(D) or FIGS. 8(A) and 8(D). The first annealing (FIGS. 7(A) and 8(A)), however, can be omitted to shorten the process time in the light of the second annealing.

Figure 10A:
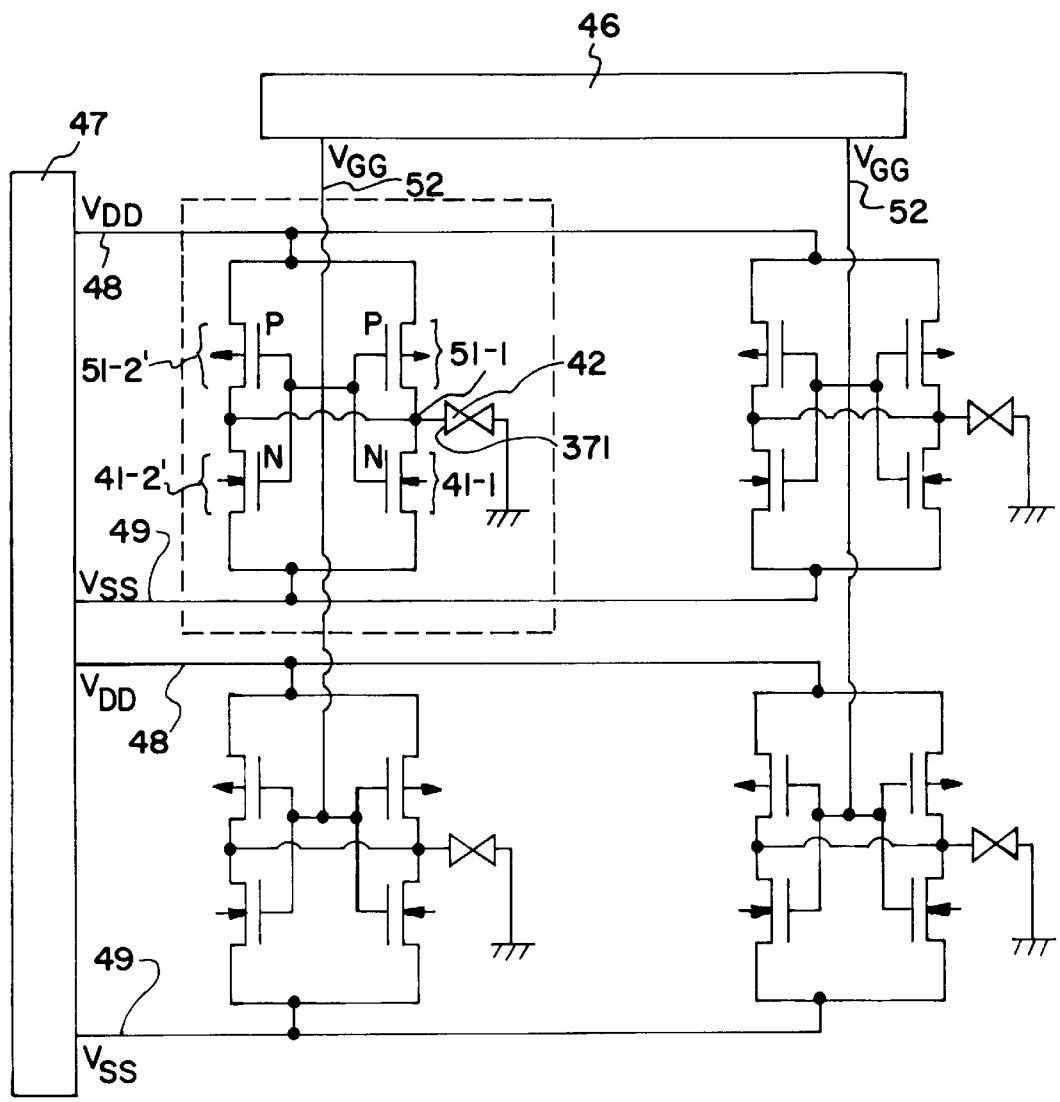
FIG. 10(A) is a schematic diagram showing an equivalent circuit of a liquid crystal display in accordance with a second embodiment of the present invention.
Figure 10B:
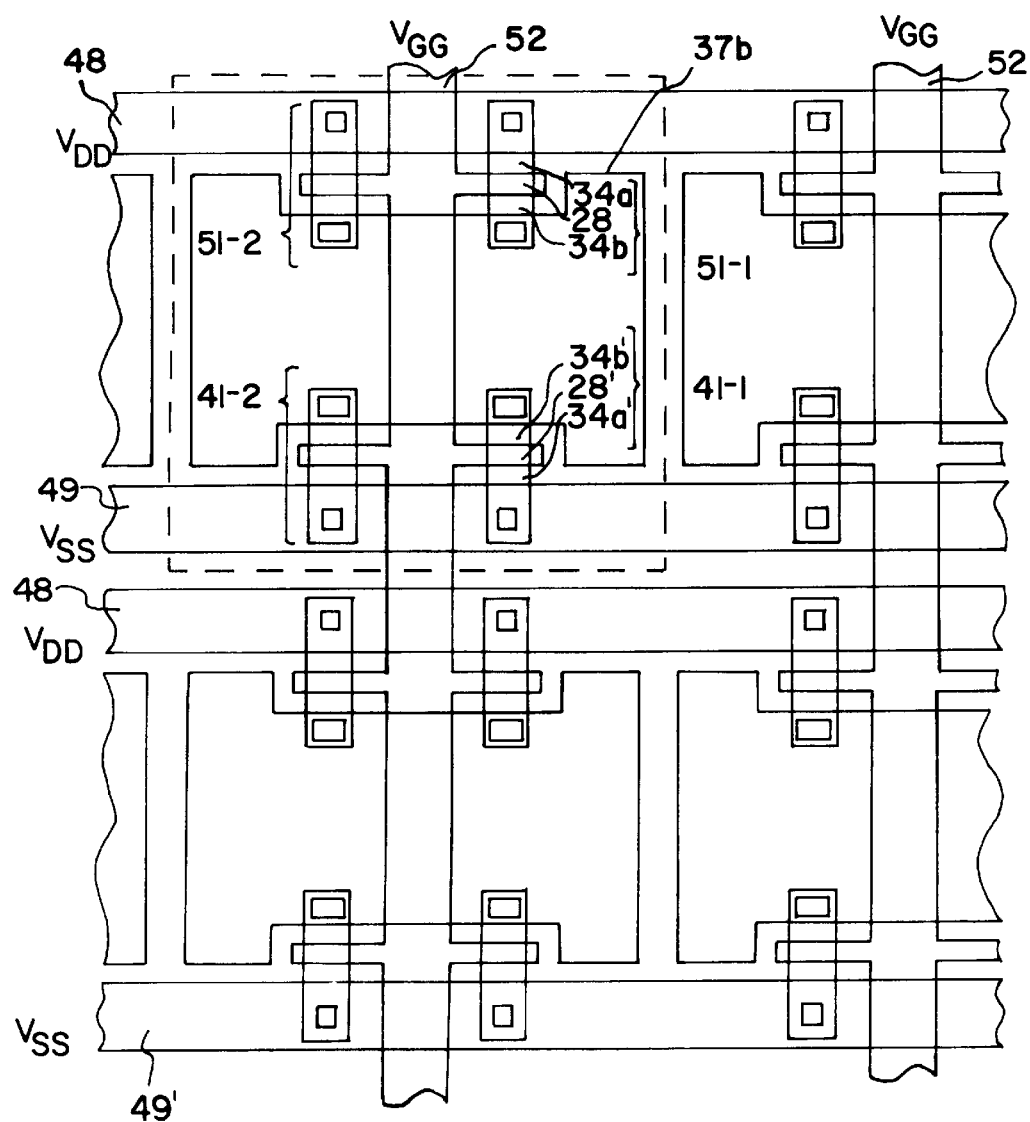
FIG. 10(B) is a plan sectional view showing the liquid crystal display illustrated in FIG. 10(A).

Referring to FIGS. 10(A) and 10(B), CMOS thin film field effect transistors in accordance with a second preferred embodiment of the present invention will be illustrated. In this embodiment, two couples of CMOS transistors 41-1, 51-1 and 41-2', 51-2' are connected in parallel to an electrode pad 33 for each pixel (as enclosed by dashed line) at their drain electrodes. These CMOS transistors are manufactured in the steps explained above in conjunction with the first embodiment except that the number of the transistors is doubled. The similar elements are given similar numerals as in the first embodiment. The electrode pads 37b have to be deposited on the VGG line through a suitable insulating film. The electrical operation is substantially same as that of the first embodiment. Accordingly, two identical individual switching elements are prepared corresponding to one pixel so that when the operation of one of them is fault, the ability of information display can be maintained by firing the fault element by laser rays in virtue of the remaining CMOS transistors. For this reason, the conductive transparent pads are formed in order not to cover these TFTS.

Figure 11B:
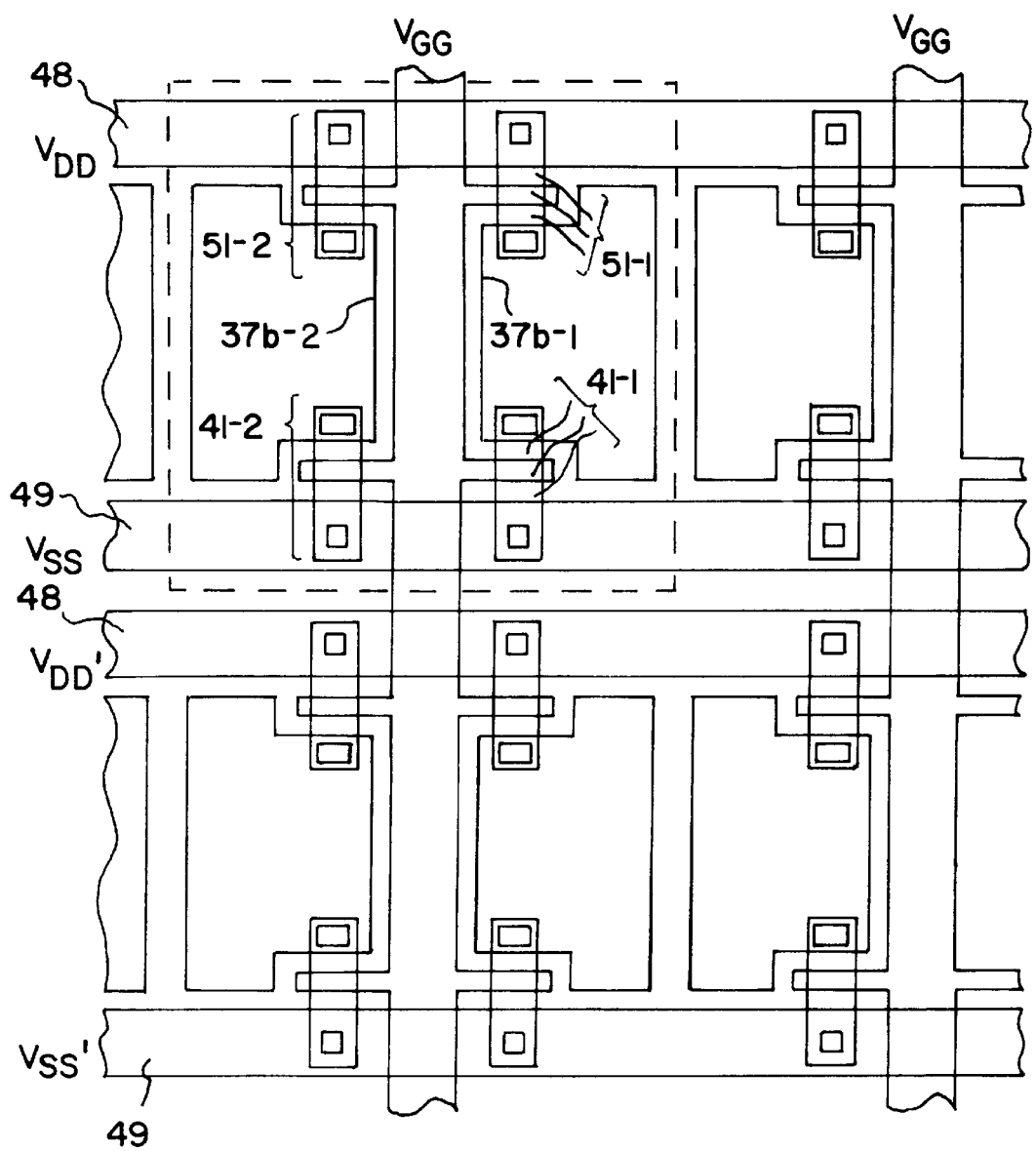
FIG. 11(B) is a plan sectional view showing the liquid crystal display illustrated in FIG. 11(A).

Referring to FIGS. 11(A) and 11(B), CMOS thin film field effect transistors in accordance with a third preferred embodiment of the present invention will be illustrated. Also in this embodiment, two couples of CMOS transistors 41-1, 51-1 and 41-2', 51-2' are connected in parallel to an electrode pad 37b for each pixel at their drain electrodes. The electrode pad 37b, however, is separated into two portions 37b-1 and 37b-2 each independently connected to a corresponding one of the two CMOS transistors. These CMOS transistors are manufactured in the steps explained above in conjunction with the first embodiment except for the number of the transistors. The similar elements are given similar numerals as in the first embodiment. Then, each pixel comprises two individual sub-pixels. In accordance with this embodiment, even if the operation of one of the sub-pixels is fault, the other sub-pixel can support the operation of the pixel and therefore the possibility of occurrence of inoperative pixels is substantially decreased. In addtion to this, such configuration is particularly appropriate in the case of color displays because the brightness of display is improved due to no use of light blocking means.

As described above, there are following advantages in accordance with the present invention:

1) There is necessarily used no particular light blocking means for preventing undesirable influences of incident light upon the channel regions of the TFTS.

2) It becomes possible to form peripheral circuits and electrode patterns for defining pixels on a same substrate.

3) Since semi-amorphous semiconductors are used in place of amorphous semiconductors and the carrier mobility is increased by one or more order of magnitude, the size of the TFT is substantially reduced so that little decrease of aperture ratio is necessary even when two TFTs are formed in one pixel.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated. Examples are as follows:

In the liquid crystal displays as illustrated above, P-type TFTs are connected to the VDD line while N-type TFTs are connected to the VSS line. However, these can be connected vice versa. Namely, N-type TFTs are connected to the VDD line while P-type TFTs are connected to the VSS line. For this purpose, the locations of the N-type TFTs and the P-type TFTs are exchanged in the above embodiments. In this case, the voltage of the liquid crystal layer (the voltage of the pad) at the respective pixel becomes the same level as the VGG when the pixel is selected by the column driver 46.

Figure 1:
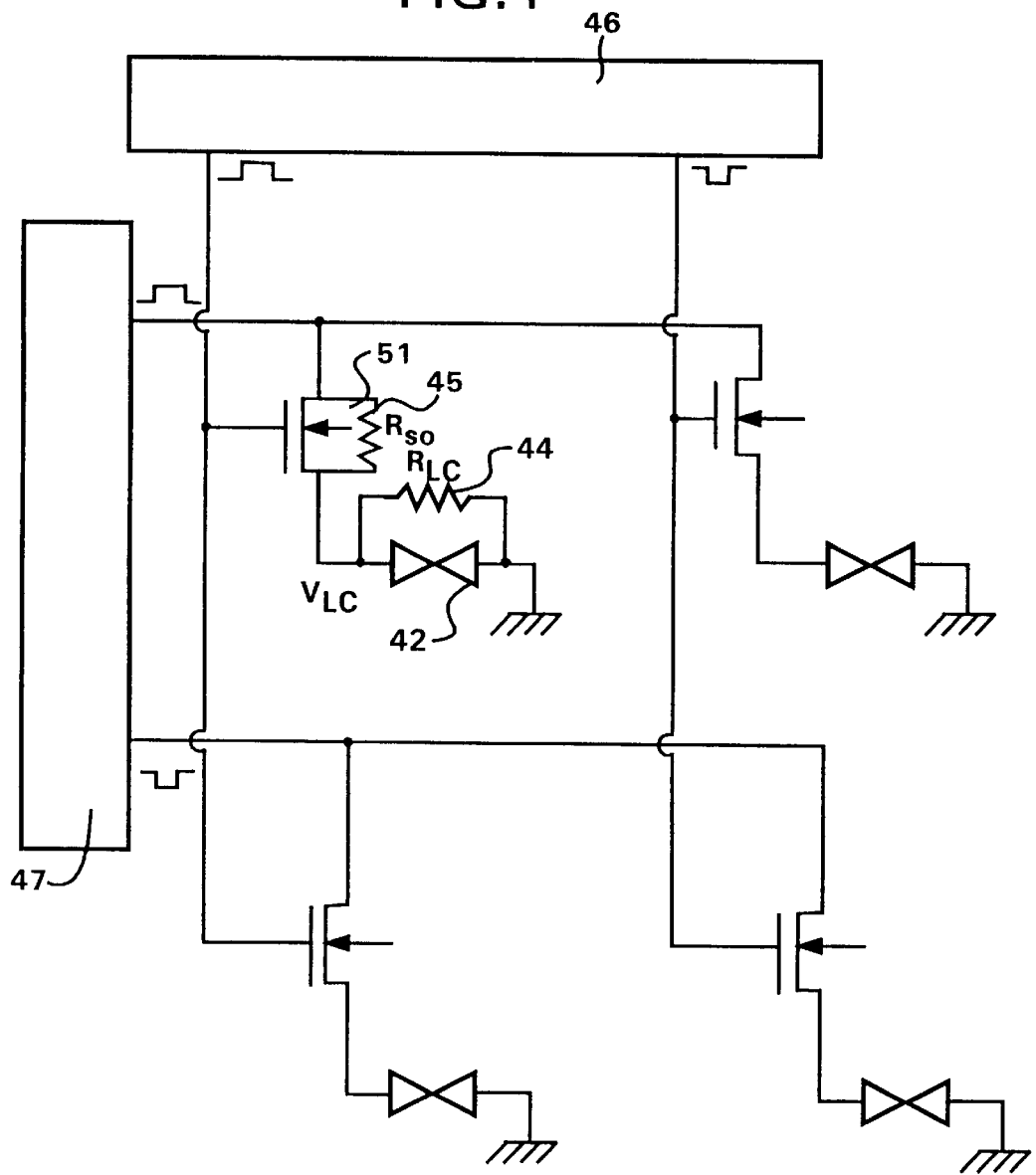
FIG. 1 is a schematic diagram showing an equivalent circuit of a liquid crystal display.

The above embodiments are applications in the form of CMOSs for switching devices in liquid crystal displays. The TFT in accordance with the present invention, however, can be utilized in the form of a switching device comprising one TFT for driving one pixel. In this case, the equivalent circuit is substantially same as that illustrated in FIG. 1 except that the resister RSD is not effective because the N-type TFT is constructed with a spoiled semiconductor film which is not sensitive to incident light as explained above. The electrode pad of each pixel becomes electrically floating when not addressed in this modification so that the voltage level thereof may not be so fixed as compared with those utilizing CMOSS. The manufacturing process thereof, however, is very simple without the need of light blocking means.

The liquid crystal material used in the liquid crystal display may include other type materials. For example, a suitable phase transition liquid crystal materials can be prepared by adding an ion dopant into a nematic liquid crystal material of guest-host type or dielectric anisotropic type. The phase transition liquid crystal material changes, in accordance with application of an electric field, its optical appearance from a transparent state to a cloudy state and vice versa through phase transition between its nematic phase and its cholesteric phase. Furthermore in place of liquid crystals, suitable light influencing materials are also utilized in the same purpose such as electrophoresis dispersions which are prepared by dispersing pigment particles in an organic liquid which has been colored by a dye.

The present invention can be applied to transistors utilizing other types of semiconductors such as germanium or silicon/germanium (SixGe1-x) semiconductors, in which case the thermal treatment can be done at temperatures approx. 100° C. lower than those used for silicon semiconductors in the above embodiments. The deposition of such semiconductor can be carried out by sputtering in a high energy hydrogen plasma caused by optical energy (shorter than 1000 nm wavelength) or electron cyclotron resonance (ECR). Instead of gases including hydrogen molecules, some hydrogen compounds can be used as the atmosphere of sputtering as long as not to be impurity. For example, monosilane or disilane may be used for forming silicon semiconductor transistors.

The semiconductor film forming the transistors may be formed in a polycrystalline structure, or other operatable structures. The semiconductor film may be given laser annealing after deposition by means of an excimer laser, instead of thermal annealing at 600° C. as described in the above embodiment in conjunction with FIG. 7(A). The annealing given to activate impurities introduced into the source and drain regions may be carried out by means of excimer laser instead of thermal annealing as described in the above embodiment in conjunction with FIG. 7(D). Hydrogen annealing may be carried out in appropriate steps at 300° C. to 400° in a hydrogen atmosphere, e.g. after formation of a semiamorphous, semicrystal or polycrystalline semiconductor film, after thermal annealing of the semiconductor film, or after formation of source and drain regions.

Although in preferred embodiments, oxide and semiconductor films are deposited respectively in separate apparatuses, it is apparently also possible to deposit other types of gate insulating films or gate electrodes in a common apparatus. During deposition of oxide films, a halogen such as fluorine may be used as an atmosphere of sputtering so as to introduce halogen atoms into the oxide films in order to effectively prevent alkali metal atoms from getting into the film from the glass substrate by virtue of neutralization. The same effect can be expected by introduction of phosphorus in place of halogens.

The present invention can be applied for other types of optical devices utilizing semiconductor devices such as image sensors, load elements or three-dimensional elements of monolithic integrated semiconductor devices. In the preferred embodiments field effect transistors are formed on a glass substrate. However, other substrates can be used instead. For example, thin film field effect transistors may be formed on a silicon substrate in a liquid crystal display or an image sensor device. This silicon substrate may be an intrinsic silicon substrate, a p-type silicon substrate, an n-type silicon substrate, or a silicon substrate in which MOSFETS, bipolar transistors, or the like are provided in the form of IC. An insulating layer is provided between such a substrate and the thin film field effect transistors although such an insulating layer may be dispensed with in the case of the intrinsic silicon substrate.

A gate electrode may be either a single layer electrode or a multi-layer electrode in a gate insulated field effect transistor in accordance with the present invention. The single layer gate electrode may be a silicon electrode doped with phosphorus or an aluminum electrode. The multi-layer gate electrode may be a two-layer electrode which consists of a lower chromium layer and an upper aluminum layer formed thereon or a two-layer electrode which consists of a lower silicon layer doped with phosphorus and an upper metallic or metal silicide layer formed thereon. The aluminum single layer electrode and the upper aluminum layer can be formed by sputtering an aluminum target. The silicon single layer electrode and the lower silicon layer can be formed by low pressure CVD or by sputtering a silicon target doped with phosphorus. The lower chromium layer can be formed by sputtering a chromium target. The metallic layer may be a molybdenum layer formed by sputtering a molybdenum target, a wolfram layer formed by sputtering a wolfram target, a titanium layer formed by sputtering a titanium target, or an aluminum layer formed by sputtering an aluminum target. The metal silicide layer may be a $MoSi_2$ layer formed by sputtering a $MoSi_2$ target, a $WSi_2$ layer formed by sputtering a $WSi_2$ target, or a $TiSi_2$ layer formed by sputtering a $TiSi_2$ target. Although the production method claims as provided infra include several steps, the order of these steps can be changed in accordance with the practical cases and should not limit the scope of patent.

What is claimed is:

1. A liquid crystal device comprising:
   a substrate having an insulating surface;
   at least one thin film transistor comprising a semiconductor layer formed on said insulating surface, said semiconductor layer having therein at least a channel region and a pair of impurity regions;
   at least one signal line for supplying signals to said at least one thin film transistor;
   an interlayer insulating film comprising an organic material over said substrate covering said at least one thin film transistor and said at least one signal line;
   at least one pixel electrode formed over said interlayer insulating film; and
   a liquid crystal layer adjacent to said pixel electrode,
   wherein at least the channel region of said semiconductor layer contains an impurity element of carbon, oxygen and nitrogen at a concentration not lower than $1 \times 10^{19}$ atoms/cm$^3$.

2. The device according to claim 1 wherein said thin film transistor is of a type selected from the group consisting of a staggered type, a coplanar type, an inverted staggered type and an inverted coplanar type.

3. The device according to claim 1 wherein said liquid crystal material comprises a material selected from the group consisting of a ferroelectric liquid crystal material, a nematic liquid crystal material, a dispersion type liquid crystal and a polymer liquid crystal.

4. The device according to claim 1 wherein said liquid crystal material comprises a nematic liquid crystal of guest host type or dielectric anisotropic type.

5. The device according to claim 1 wherein said device is a reflection type.

6. The device according to claim 1 wherein said device is a transmission type.

7. The device according to claim 1 wherein said semiconductor layer comprises crystalline silicon doped with hydrogen.

8. A liquid crystal device comprising:

a substrate having an insulating surface;

at least one thin film transistor comprising a semiconductor layer formed on said insulating surface, said semiconductor layer having therein at least a channel region and a pair of impurity regions;

at least one signal line for supplying signals to said at least one thin film transistor;

an interlayer insulating film comprising an organic material over said substrate covering said at least one thin film transistor and said at least one signal line;

at least one pixel electrode formed over said interlayer insulating film; and a liquid crystal layer adjacent to said pixel electrode, wherein the channel region of said semiconductor layer and at least portions of said pair of impurity regions in the vicinity of said channel region contain an impurity element of carbon, oxygen and nitrogen at a concentration not lower than $1 \times 10^{19}$ atom/cm$^3$.

9. The device according to claim 8 wherein said thin film transistor is of a type selected from the group consisting of a staggered type, a coplanar type, an inverted staggered type and an inverted coplanar type.

10. The device according to claim 8 wherein said liquid crystal material comprises a material selected from the group consisting of a ferroelectric liquid crystal material, a nematic liquid crystal material, a dispersion type liquid crystal and a polymer liquid crystal.

11. The device according to claim 8 wherein said liquid crystal material comprises a nematic liquid crystal of guest host type or dielectric anisotropic type.

12. The device according to claim 8 wherein said device is a reflection type.

13. The device according to claim 8 wherein said device is a transmission type.

14. The device according to claim 8 wherein said semiconductor layer comprises crystalline silicon doped with hydrogen.

15. A liquid crystal device comprising:

a substrate having an insulating surface;

at least one thin film transistor comprising a semiconductor layer formed on said insulating surface, said semiconductor layer having therein at least a channel region and a pair of impurity regions;

at least one signal line for supplying signals to said at least one thin film transistor;

an interlayer insulating film comprising an organic material over said substrate covering said at least one thin film transistor and said at least one signal line;

at lease one pixel electrode formed over said interlayer insulating film; and a liquid crystal layer adjacent to said pixel electrode, wherein at least the channel region of said semiconductor layer contains an impurity element of carbon, oxygen and nitrogen at a concentration not lower than $1 \times 10^{19}$ atoms/cm$^3$ and said signal line is completely covered by said pixel electrode.

16. The device according to claim 15 wherein said thin film transistor is of a type selected from the group consisting of a staggered type, a coplanar type, an inverted staggered type and an inverted coplanar type.

17. The device according to claim 15 wherein said liquid crystal material comprises a material selected from the group consisting of a ferroelectric liquid crystal material, a nematic liquid crystal material, a dispersion type liquid crystal and a polymer liquid crystal.

18. The device according to claim 15 wherein said liquid crystal material comprises a nematic liquid crystal of guest host type or dielectric anisotropic type.

19. The device according to claim 15 wherein said device is a reflection type.

20. The device according to claim 15 wherein said device is a transmission type.

21. The device according to claim 15 wherein said semiconductor layer comprises crystalline silicon doped with hydrogen.

22. A liquid crystal device comprising;

a substrate having an insulating surface;

at least one thin film transistor comprising a semiconductor layer formed on said insulating surface, said semiconductor layer having therein at least a channel region and a pair of impurity regions;

at least one signal line for supplying signals to said at least one thin film transistor;

an interlayer insulating film comprising an organic material over said substrate covering said at least one thin film transistor and said at least one signal line;

at least one pixel electrode formed over said interlayer insulating film; and a liquid crystal layer adjacent to said pixel electrode, wherein at least the channel region of said semiconductor layer contains an impurity element of carbon, oxygen and nitrogen at a concentration not lower than $1 \times 10^{19}$ atoms/cm$^3$ and said at least one signal line extends below a middle portion of said at least one pixel electrode.

23. The device according to claim 22 wherein said thin film transistor is of a type selected from the group consisting of a staggered type, a coplanar type, an inverted staggered type and an inverted coplanar type.

24. The device according to claim 22 wherein said liquid crystal material comprises a material selected from the group consisting of a ferroelectric liquid crystal material, a nematic liquid crystal material, a dispersion type liquid crystal and a polymer liquid crystal.

25. The device according to claim 22 wherein said liquid crystal material comprises a nematic crystal of guest host type or dielectric anisotropic type.

26. The device according to claim 22 wherein said device is a reflection type.

27. The device according to claim 22 wherein said device is a transmission type.

28. The device according to claim 22 wherein said semiconductor layer comprises crystalline silicon doped with hydrogen.

29. A semiconductor device comprising:

a substrate having an insulating surface;

a thin film transistor including at least a semiconductor layer comprising silicon formed on said insulating surface and a gate electrode adjacent to said semiconductor layer with a gate insulating film interposed therebetween;

wherein said semiconductor layer contains an impurity element of carbon, oxygen and nitrogen at a concentration not lower than $1 \times 10^{19}$ atoms/cm$^3$ and baron at a concentration from $1 \times 10^{15}$ to $5 \times 10^{17}$ atoms/cm$^3$.

30. The device according to claim 29 wherein said thin film transistor is of a type selected from the group consisting of a staggered type, a coplanar type, an inverted staggered type and an inverted coplanar type.

31. The device according to claim 29 wherein said semiconductor layer comprises crystalline silicon doped with hydrogen.

32. The device according to claim 29 wherein said thin film transistor is an N-channel type thin film transistor.

33. The device according to claim 29 wherein said thin film transistor is a P-channel type thin film transistor.

34. A semiconductor device comprising:

a substrate having an insulating surface;

an N-channel type thin film transistor and a P-channel type thin film transistor, each thin film transistor including at least a semiconductor layer comprising silicon formed on said insulating surface and a gate electrode adjacent to said semiconductor layer with a gate insulating film interposed therebetween, wherein said semiconductor layer contains impurity element of carbon, oxygen and nitrogen at a concentration not lower $1 \times 10^{19}$ atoms/cm$^3$;

wherein the semiconductor layer of at least one of said N-channel type thin film transistor and said P-channel type thin film transistor contain boron at a concentration from $1 \times 10^{15}$ to $5 \times 10^{17}$ atoms/cm$^3$.

35. The device according to claim 34 wherein said semiconductor layer comprises crystalline doped with hydrogen.

36. A semiconductor device comprising:

a substrate having an insulating surface;

an inverted staggered type thin film transistor including at least a semiconductor layer comprising silicon formed on said insulating surface and a gate electrode adjacent to said semiconductor layer with a gate insulating film interposed therebetween;

wherein said semiconductor layer contains an impurity element of carbon, oxygen and nitrogen at a concentration not lower than $1 \times 10^{19}$ atoms/cm$^3$ and boron at a concentration from $1 \times 10^{15}$ to $5 \times 10^{17}$ atoms/cm$^3$.

37. The device according to claim 36 wherein said thin film transistor is an N-channel type thin film transistor.

38. The device according to claim 36 wherein said thin film transistor is a P-channel type thin film transistor.

39. A liquid crystal device comprising:

a substrate having an insulating surface;

a thin film transistor including at least a semiconductor layer comprising silicon formed on said insulating surface and a gate electrode adjacent to said semiconductor layer with a gate insulating film interposed therebetween;

a pixel electrode electrically connected to said thin film transistor; and a liquid crystal layer adjacent to said pixel electrode, wherein said semiconductor layer contains an impurity element of carbon, oxygen and nitrogen at a concentration not lower than $1 \times 10^{19}$ atoms/cm$^3$ and boron at a concentration from $1 \times 10^{15}$ to $5 \times 10^{17}$ atoms/cm$^3$.

40. The device according to claim 39 wherein said thin film transistor is an N-channel type thin film transistor.

41. The device according to claim 39 wherein said thin film transistor ia a P-channel type thin film transistor.

42. The device according to claim 39 wherein said liquid crystal material comprises a material selected from the group consisting of a ferroelectric liquid crystal material, a nematic liquid crystal material, a dispersion type liquid crystal and a polymer liquid crystal.

43. The device according to claim 39 wherein said liquid crystal material comprises a nematic liquid crystal of guest host type or dielectric anisotropic type.

44. The device according to claim 39 wherein said device is a reflection type.

45. The device according to claim 39 wherein said device is a transmission type.

46. A liquid crystal device comprising:

a substrate having an insulating surface;

an N-channel type thin film transistor and a P-channel type thin film transistor, each thin film transistor including at least a semiconductor layer comprising silicon formed on said insulating surface and a gate, electrode adjacent to said semiconductor layer with a gate insulating film interposed therebetween, wherein said semiconductor layer contains an impurity element of carbon, oxygen and nitrogen at a concentrating not lower than $1 \times 10^{19}$ atoms/cm$^3$;

a pixel electrode electrically connected to said thin film transistor; and a liquid crystal layer adjacent to sad pixel electrode, wherein the semiconductor layer of at least one of sad N-channel type thin film transistor and said P-channel type thin film transistor contains boron at a concentration from $1 \times 10^{15}$ to $5 \times 10^{17}$ atoms/cm$^3$.

47. The device according to claim 46 wherein said semiconductor layer comprises crystalline silicon doped with hydrogen.

48. The device according to claim 46 wherein said liquid crystal material comprises a material selected from the group consisting of a ferroelectric liquid crystal material, a nematic liquid crystal material, a dispersion type liquid crystal and a polymer liquid crystal.

49. The device according to claim 46 wherein said liquid crystal material comprises a nematic liquid crystal of guest host type or dielectric anisotropic type.

50. The device according to claim 46 wherein said device is a reflection type.

51. The device according to claim 46 wherein said device is a transmission type.

52. A liquid crystal device comprising:

a substrate having an insulating surface;

a thin film transistor including at least a semiconductor layer comprising silicon formed on said insulating surface and a gate electrode adjacent to said semiconductor layer with a gate insulating film interposed therebetween;

an organic resin film formed over said thin film transistor;

a pixel electrode formed over said organic resin film electrically connected to said thin film transistor, and a liquid crystal layer adjacent to said pixel electrode, wherein said semiconductor layer contains an impurity element of carbon, oxygen and nitrogen at a concentration not lower than $1 \times 10^{19}$ atoms cm$^{/3}$ and boron at a concentration from $1 \times 10^{15}$ to $5 \times 10^{17}$ atoms/cm$^3$.

53. The device according to claim 52 wherein said thin film transistor is an N-channel type thin film transistor.

54. The device according to claim 52 wherein said thin film transistor is a P-channel type thin film transistor.

55. The device according to claim 52 wherein said liquid crystal material comprises a material selected from the group consisting of a ferroelectric liquid crystal material, a nematic liquid crystal material, a dispersion type liquid crystal and a polymer liquid crystal.

56. The device according to claim 52 wherein said liquid crystal material comprises a nematic liquid crystal of guest host type or dielectric anisotropic type.

57. The device according to claim 52 wherein said device is a reflection type.

58. The device according to claim 52 wherein said device is a transmission type.

* * * * *